United States Patent
Yoshizumi et al.

(10) Patent No.: US 8,541,253 B2
(45) Date of Patent: *Sep. 24, 2013

(54) III-NITRIDE SEMICONDUCTOR LASER DEVICE, AND METHOD OF FABRICATING THE III-NITRIDE SEMICONDUCTOR LASER DEVICE

(75) Inventors: Yusuke Yoshizumi, Itami (JP); Yohei Enya, Itami (JP); Takashi Kyono, Itami (JP); Masahiro Adachi, Osaka (JP); Shinji Tokuyama, Osaka (JP); Takamichi Sumitomo, Itami (JP); Masaki Ueno, Itami (JP); Takatoshi Ikegami, Itami (JP); Koji Katayama, Osaka (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/416,844

(22) Filed: Mar. 9, 2012

(65) Prior Publication Data

US 2012/0202304 A1 Aug. 9, 2012

Related U.S. Application Data

(62) Division of application No. 12/831,566, filed on Jul. 7, 2010.

(30) Foreign Application Priority Data

Sep. 30, 2009 (JP) ................................. 2009-228747

(51) Int. Cl.
*H01L 21/00* (2006.01)

(52) U.S. Cl.
USPC ..................... 438/46; 438/47; 257/E33.023

(58) Field of Classification Search
USPC .............................. 438/46, 47; 257/E33.023
See application file for complete search history.

(56) References Cited

U.S. PATENT DOCUMENTS 7,933,303 B2 * 4/2011 Yoshizumi et al. ...... 372/44.011
8,071,405 B2 * 12/2011 Takagi et al. ................... 438/33
(Continued)

FOREIGN PATENT DOCUMENTS

| JP | 2008-187044 A | 8/2008 |
| JP | 2009-081428 | 4/2009 |

(Continued)

OTHER PUBLICATIONS

Kuniyoshi Okamoto et al., "Nonpolar *m*-plane InGaN multiple quantum well laser diodes with a lasing wavelength of 499.8 nm," Applied Physics Letters, vol. 94, pp. 071105-1-071105-3 (2009).

(Continued)

*Primary Examiner* — Mary Wilczewski
(74) *Attorney, Agent, or Firm* — Venable LLP; Michael A. Sartori; Tamatane J. Aga

(57) ABSTRACT

A method of fabricating a III-nitride semiconductor laser device includes: preparing a substrate with a semipolar primary surface, the semipolar primary surface including a hexagonal III-nitride semiconductor; forming a substrate product having a laser structure, an anode electrode, and a cathode electrode, the laser structure including a substrate and a semiconductor region, and the semiconductor region being formed on the semipolar primary surface; after forming the substrate product, forming first and second end faces; and forming first and second dielectric multilayer films for an optical cavity of the nitride semiconductor laser device on the first and second end faces, respectively.

11 Claims, 16 Drawing Sheets

(56) References Cited

U.S. PATENT DOCUMENTS

| | | | |
|---|---|---|---|
| 8,076,167 B2* | 12/2011 | Takagi et al. | 438/33 |
| 8,105,857 B2* | 1/2012 | Takagi et al. | 438/33 |
| 8,139,619 B2* | 3/2012 | Takagi et al. | 372/44.011 |
| 8,175,129 B2* | 5/2012 | Yoshizumi et al. | 372/45.01 |
| 8,213,475 B2* | 7/2012 | Takagi et al. | 372/45.01 |
| 8,227,277 B2* | 7/2012 | Yoshizumi et al. | 438/33 |
| 2008/0191223 A1* | 8/2008 | Nakamura et al. | 257/95 |
| 2009/0086778 A1* | 4/2009 | Kameyama et al. | 372/44.01 |
| 2009/0101927 A1 | 4/2009 | Kohda | |
| 2009/0200573 A1 | 8/2009 | Kawakami et al. | |
| 2009/0252191 A1* | 10/2009 | Kubota et al. | 372/50.11 |
| 2010/0309943 A1* | 12/2010 | Chakraborty et al. | 372/45.012 |
| 2010/0322276 A1* | 12/2010 | Yoshizumi et al. | 372/44.011 |
| 2011/0058585 A1* | 3/2011 | Yoshizumi et al. | 372/45.01 |
| 2011/0064100 A1* | 3/2011 | Raring et al. | 372/44.011 |
| 2011/0075694 A1* | 3/2011 | Yoshizumi et al. | 372/45.01 |
| 2011/0075695 A1* | 3/2011 | Yoshizumi et al. | 372/45.011 |
| 2011/0128983 A1* | 6/2011 | Takagi et al. | 372/45.01 |
| 2011/0158275 A1* | 6/2011 | Yoshizumi et al. | 372/44.011 |
| 2011/0158276 A1* | 6/2011 | Takagi et al. | 372/44.011 |
| 2011/0158277 A1* | 6/2011 | Yoshizumi et al. | 372/44.011 |
| 2011/0164637 A1* | 7/2011 | Yoshizumi et al. | 372/44.011 |
| 2011/0164638 A1* | 7/2011 | Yoshizumi et al. | 372/45.01 |
| 2011/0176569 A1* | 7/2011 | Takagi et al. | 372/45.01 |
| 2011/0182311 A1* | 7/2011 | Yoshizumi et al. | 372/44.011 |
| 2011/0228804 A1* | 9/2011 | Yoshizumi et al. | 372/44.011 |
| 2011/0228864 A1* | 9/2011 | Aryanfar et al. | 375/259 |
| 2011/0292956 A1* | 12/2011 | Takagi et al. | 372/44.011 |
| 2011/0299560 A1* | 12/2011 | Takagi et al. | 372/44.011 |
| 2011/0300653 A1* | 12/2011 | Takagi et al. | 438/33 |
| 2012/0027039 A1* | 2/2012 | Takagi et al. | 372/45.01 |
| 2012/0058583 A1* | 3/2012 | Yoshizumi et al. | 438/33 |
| 2012/0088326 A1* | 4/2012 | Yoshizumi et al. | 438/33 |
| 2012/0100654 A1* | 4/2012 | Takagi et al. | 438/46 |
| 2012/0107968 A1* | 5/2012 | Yoshizumi et al. | 438/5 |
| 2012/0112203 A1* | 5/2012 | Enya et al. | 257/76 |
| 2012/0135554 A1* | 5/2012 | Yoshizumi et al. | 438/33 |
| 2012/0142130 A1* | 6/2012 | Yoshizumi et al. | 438/33 |
| 2012/0184057 A1* | 7/2012 | Yoshizumi et al. | 438/29 |
| 2012/0202304 A1* | 8/2012 | Yoshizumi et al. | 438/33 |
| 2012/0214268 A1* | 8/2012 | Takagi et al. | 438/33 |

FOREIGN PATENT DOCUMENTS

| | | |
|---|---|---|
| JP | 2009-141132 | 6/2009 |
| WO | WO-2009/041462 A1 | 4/2009 |

OTHER PUBLICATIONS

You-Da Lin et al., "Blue-Green InGAN/GaN Laser Diodes on Miscut m-Plane GaN Substrate," Applied Physics Express, vol. 2, pp. 082102-1-082102-3 (2009).

Asamizu, H. et al., "Continuous-Wave Operation of InGaN/GaN Laser Diodes on Semipolar (11-22) Plane Gallium Nitrides," Applied Physics Express, vol. 2, pp. 021002-1-021002-3, (2009).

Tyagi, A. et al. "Semipolar (10-1-1) InGaN/GaN Laser Diodes on Bulk GaN Substrates," Japanese Journal of Applied Physics, vol. 46, No. 19, pp. L444-L445 (2007).

* cited by examiner

Fig.6
(a)
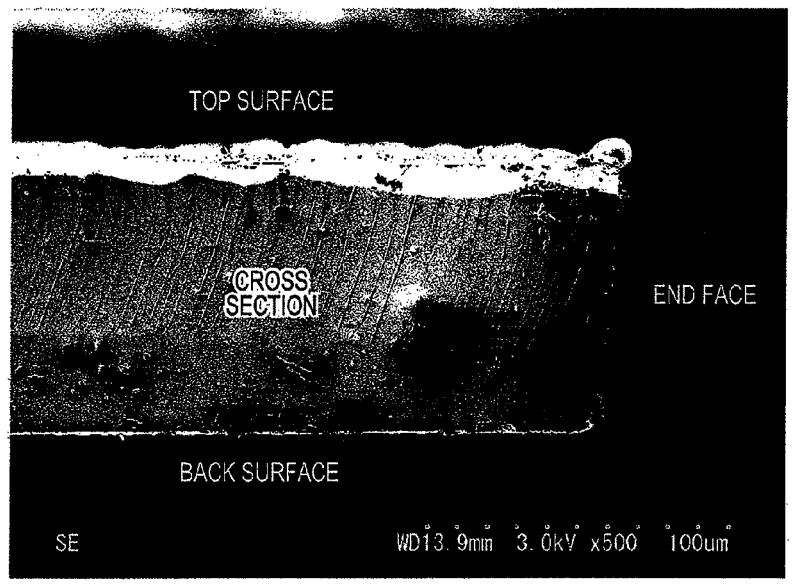
(b)
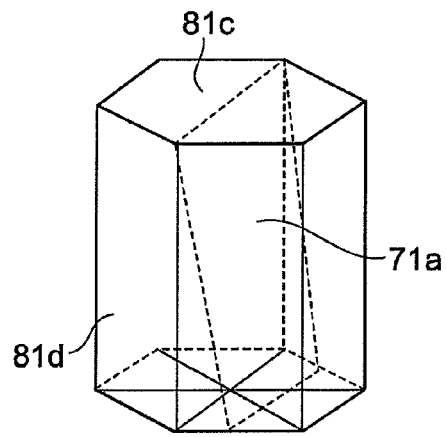
(c)
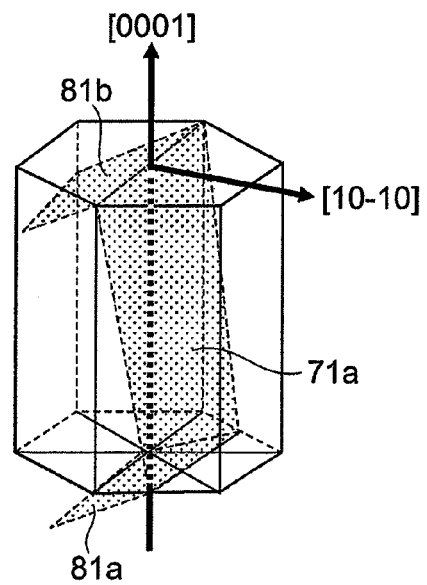

III-NITRIDE SEMICONDUCTOR LASER DEVICE, AND METHOD OF FABRICATING THE III-NITRIDE SEMICONDUCTOR LASER DEVICE

CROSS-REFERENCE TO RELATED APPLICATIONS

This application is a Divisional of U.S. patent application Ser. No. 12/831,566, filed Jul. 7, 2010, which claims the benefit of Japan Patent Application No. 2009-228747, filed Sep. 30, 2009, all of which are incorporated herein by reference in their entirety.

BACKGROUND OF THE INVENTION

1. Field of the Invention

The present invention relates to a group-III nitride semiconductor laser device, and a method of fabricating the group-III nitride semiconductor laser device.

2. Related Background Art

Non Patent Literature 1 discloses a laser diode made on an m-plane GaN substrate. The laser diode has two cleaved end faces for an optical cavity. One of the cleaved end faces is a +c plane and the other cleaved end faces is a −c plane. In this laser diode, the reflectance of a dielectric multilayer film on the front end face (emitting face) is 70% and the reflectance of a dielectric multilayer film on the rear end face is 99%.

Non Patent Literature 2 discloses a laser diode made on a GaN substrate inclined at the angle of 1 degree with respect to the m-plane to the −c axis direction. The laser diode has two cleaved end faces for an optical cavity. One cleaved end face is a +c plane and the other cleaved end face is a −c plane. In this laser diode, the reflectance of the dielectric multilayer film on the front end face (exit face) is 90% and the reflectance of the dielectric multilayer film on the rear end face is 95%.

Non Patent Literature 1: APPLIED PHYSICS LETTERS 94, (2009), 071105.

Non Patent Literature 2: Applied Physics Express 2, (2009), 082102.

SUMMARY OF THE INVENTION

A light emitting device is made on a semipolar surface of a GaN substrate. In the GaN surface having semipolar nature, the c-axis of GaN is inclined with respect to a normal to the semipolar surface of the GaN substrate. In fabrication of a semiconductor laser using the GaN semipolar surface, when the c-axis of GaN is inclined toward an extending direction of a waveguide of the semiconductor laser, it becomes feasible to form the end faces available for an optical cavity. Dielectric multilayer films with desired reflectances are formed on these respective end faces to form the optical cavity. The thicknesses of the dielectric multilayer films on the two end faces are different from each other in order to obtain the dielectric multilayer films with the mutually different reflectances. Since a laser beam is emitted from the front end face, the reflectance of the dielectric multilayer film on the front end face is set smaller than that of the dielectric multilayer film on the rear end face.

It is found by Inventors' experiments that when some semiconductor lasers are fabricated as described above, these semiconductor lasers have various device lifetimes and we do not have any clear reasons for the long device lifetimes and short device lifetimes. The Inventors conduct research on this point and come to find that the difference in the device lifetime is associated with crystal orientations of the semiconductor end faces for the optical cavity and the thicknesses of the dielectric multilayer films formed thereon.

It is an object of the present invention to provide a III-nitride semiconductor laser device with a long device lifetime. It is another object of the present invention to provide a method of fabricating a III-nitride semiconductor laser device with a long device lifetime.

A III-nitride semiconductor laser device according to a first aspect of the present invention comprises: (a) a laser structure comprising a support base and a semiconductor region, the support base having a semipolar primary surface of a III-nitride semiconductor, and the semiconductor region being provided on the semipolar primary surface of the support base; and (b) first and second dielectric multilayer films for an optical cavity of the nitride semiconductor laser device, the first and second dielectric multilayer films being provided on first and second end faces of the semiconductor region, respectively, the semiconductor region including a first cladding layer of a first conductivity type gallium nitride-based semiconductor, a second cladding layer of a second conductivity type gallium nitride-based semiconductor, and an active layer, and the an active layer being provided between the first cladding layer and the second cladding layer, the first cladding layer, the second cladding layer, and the active layer being arranged in a normal axis to the semipolar primary surface, the active layer comprising a gallium nitride-based semiconductor layer, a c+ axis vector being inclined at an angle in a range of not less than 45 degrees and not more than 80 degrees and of not less than 100 degrees and not more than 135 degrees toward a direction of any one crystal axis of m- and a-axes of the III-nitride semiconductor with respect to a normal vector, the c+ axis vector indicating a direction of a <0001> axis of the III-nitride semiconductor of the support base, and the normal vector indicating a direction of the normal axis, the first and second end faces intersecting with a reference plane, the reference plane being defined by the normal axis and the one crystal axis of the hexagonal III-nitride semiconductor, the c+ axis vector making an acute angle with a waveguide vector, and the waveguide vector indicating a direction from the second end face to the first end face, and a thickness of the second dielectric multilayer film being smaller than a thickness of the first dielectric multilayer film.

In this III-nitride semiconductor laser device, the c+ axis vector makes the acute angle with the waveguide vector and this waveguide vector is directed in the direction from the second end face to the first end face. An angle between the c+ axis vector and a vector normal to the second end face is larger than an angle between the c+ axis vector and a vector normal to the first end face. In this laser device, since the thickness of the second dielectric multilayer film on the second end face is smaller than the thickness of the first dielectric multilayer film on the first end face, the second dielectric multilayer film on the second end face works as the front side and a laser beam is emitted from this front side. The first dielectric multilayer film on the first end face works as the rear side and most of the laser beam is reflected by this rear side. In the laser device on the semipolar plane, when the thickness of the second dielectric multilayer film on the front side is smaller than the thickness of the first dielectric multilayer film on the rear side, reduction is achieved in device degradation due to the dielectric multilayer film on the end face, so as to avoid reduction in device lifetime.

The III-nitride semiconductor laser device according to the first aspect of the present invention can be configured as follows: the semiconductor region is located between the first surface and the support base, and wherein each of the first and second end faces is included in a fractured face, and the fractured face extends from an edge of the first surface to an edge of the second surface.

Since in the III-nitride semiconductor laser device the first and second end faces of the laser structure intersect with the reference plane defined by the normal axis to the primary surface and the a-axis or m-axis of the hexagonal III-nitride semiconductor, the first and second end faces can be formed as fractured faces, and each of the fractured faces extends from the edge of the first surface to the edge of the second surface.

The III-nitride semiconductor laser device according to the first aspect of the present invention can be configured so that the c-axis of the III-nitride semiconductor is inclined toward the direction of the m-axis of the nitride semiconductor. In another embodiment, the III-nitride semiconductor laser device according to the first aspect of the present invention can be configured so that the c-axis of the III-nitride semiconductor is inclined toward the direction of the a-axis of the nitride semiconductor.

The III-nitride semiconductor laser device according to the first aspect of the present invention can be configured so that the primary surface of the support base is inclined in the range of not less than −4 degrees and not more than +4 degrees with respect to any one of {10-11}, {20-21}, {20-2-1}, and {10-1-1} planes. Furthermore, the III-nitride semiconductor laser device according to the first aspect of the present invention can be configured so that the primary surface of the support base is any one of the {10-11} plane, {20-21} plane, {20-2-1} plane, and {10-1-1} plane.

In this III-nitride semiconductor laser device, when the c-axis of the III-nitride semiconductor is inclined toward the direction of the m-axis of the nitride semiconductor, practical plane orientations and angular range for the primary surface can include at least the aforementioned plane orientations and angle range.

The III-nitride semiconductor laser device according to the first aspect of the present invention can be configured so that the primary surface of the support base is inclined in the range of not less than −4 degrees and not more than +4 degrees from any one of {11-22}, {11-21}, {11-2-1}, and {11-2-2} planes. Furthermore, the III-nitride semiconductor laser device according to the first aspect of the present invention can be configured so that the primary surface of the support base is any one of the {11-22} plane, {11-21} plane, {11-2-1} plane, and {11-2-2} plane.

In this III-nitride semiconductor laser device, when the c-axis of the III-nitride semiconductor is inclined toward the direction of the a-axis of the nitride semiconductor, practical plane orientations and angular range for the primary surface can encompass at least the aforementioned plane orientations and angle range.

The III-nitride semiconductor laser device according to the first aspect of the present invention can be configured so that the active layer comprises a well layer comprised of a strained gallium nitride-based semiconductor containing indium as a constituent element. Furthermore, the III-nitride semiconductor laser device according to the first aspect of the present invention can be configured so that the active layer comprises a well layer comprised of strained InGaN.

With this III-nitride semiconductor laser device, the degradation of interest is observed in the GaN-based semiconductor containing indium as a Group III constituent element. The degree of degradation becomes more prominent with increase in the indium composition.

The III-nitride semiconductor laser device according to the first aspect of the present invention can be configured so that the active layer is adapted to generate light at a wavelength of 430 to 550 nm.

This III-nitride semiconductor laser device can provide the light in the aforementioned wavelength range by use of the well layer that comprises the strained GaN-based semiconductor containing, for example, indium as a Group III constituent element.

The III-nitride semiconductor laser device according to the first aspect of the present invention can be configured so that the III-nitride semiconductor is GaN. With this III-nitride semiconductor laser device, for example, the emission of light in the aforementioned wavelength range (wavelength range from blue to green) can be provided by creation of the laser structure using the GaN primary surface.

In the III-nitride semiconductor laser device according to the first aspect of the present invention, the first dielectric multilayer film has a dielectric layer, and the dielectric layer in the first dielectric multilayer film is comprised of at least one of silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide. The second dielectric multilayer film has a dielectric layer, and the dielectric layer in the second dielectric multilayer film is comprised of at least one of silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide.

In this III-nitride semiconductor laser device, practical materials of the dielectric films can include silicon oxide (e.g., $SiO_2$), silicon nitride (e.g., $Si_3N_4$), silicon oxynitride (e.g., $SiO_xN_{1-x}$), titanium oxide (e.g., $TiO_2$), titanium nitride (e.g., TiN), titanium oxynitride (e.g., $TiO_xN_{1-x}$), zirconium oxide (e.g., $ZrO_2$), zirconium nitride (e.g., ZrN), zirconium oxynitride (e.g., $ZrO_xN_{1-x}$), zirconium fluoride (e.g., $ZrF_4$), tantalum oxide (e.g., $Ta_2O_5$), tantalum nitride (e.g., $Ta_3N_5$), tantalum oxynitride (e.g., $TaO_xN_{1-x}$), hafnium oxide (e.g., $HfO_2$), hafnium nitride (e.g., HfN), hafnium oxynitride (e.g., $HfO_xN_{1-x}$), hafnium fluoride (e.g., $HfF_4$), aluminum oxide (e.g., $Al_2O_3$), aluminum nitride (e.g., AlN), aluminum oxynitride (e.g., $AlO_xN_{1-x}$), magnesium fluoride (e.g., $MgF_2$), magnesium oxide (e.g., MgO), magnesium nitride (e.g., $Mg_3N_2$), magnesium oxynitride (e.g., $MgO_xN_{1-x}$), calcium fluoride (e.g., $CO_2$), barium fluoride (e.g., $BaF_2$), cerium fluoride (e.g., $CeF_3$), antimony oxide (e.g., $Sb_2O_3$), bismuth oxide (e.g., $Bi_2O_3$), and gadolinium oxide (e.g., $Gd_2O_3$).

A second aspect of the present invention relates to a method of fabricating a III-nitride semiconductor laser device. This method comprises the steps of: (a) preparing a substrate with a semipolar primary surface, the semipolar primary surface comprising a hexagonal III-nitride semiconductor; (b) forming a substrate product having a laser structure, an anode electrode, and a cathode electrode, the laser structure comprising a substrate and a semiconductor region, and the semiconductor region being formed on the semipolar primary surface; (c) after forming the substrate product, forming first and second end faces; and (d) forming first and second dielectric multilayer films for an optical cavity of the nitride semiconductor laser device on the first and second end faces, respectively, the first and second end faces intersecting with a reference plane, the reference plane being defined by a normal axis to the semipolar primary surface and any one crystal axis of a- and m-axes of the hexagonal III-nitride semiconductor, the semiconductor region comprising a first cladding layer of a first conductivity type gallium nitride-based semiconductor, a second cladding layer of a second conductivity type gallium nitride-based semiconductor, and an active layer, and the active layer being provided between the first cladding layer and the second cladding layer, the first cladding layer, the second cladding layer, and the active layer being arranged in a direction of the normal axis, the active layer comprising a gallium nitride-based semiconductor layer, the semipolar primary surface of the substrate being inclined at an angle in a range of not less than 45 degrees and not more than 80 degrees and of not less than 100 degrees and not more than 135 degrees with respect to a plane perpendicular to a c+ axis vector, and the c+ axis vector indicating a direction of the <0001> axis of the nitride semiconductor, the c+ axis vector making an acute angle with a waveguide vector, and the waveguide vector indicating a direction from the second end face to the first end face, and a thickness of the second dielectric multilayer film being smaller than a thickness of the first dielectric multilayer film.

According to this method, the waveguide vector making the acute angle with the c+ axis vector corresponds to the direction from the second end face to the first end face and the second dielectric multilayer film (C− side) on the second end face is formed so as to be thinner than the first dielectric multilayer film (C+ side) on the first end face in thickness; therefore, it is feasible to reduce the device degradation with deterioration of crystal quality proceeding from the second end face due to the dielectric multilayer film on the end face, and thereby avoiding the reduction in device lifetime. In this III-nitride semiconductor laser device, the angle between the c+ axis vector and the normal vector to the second end face is larger than the angle between the c+ axis vector and the normal vector to the first end face. When the thickness of the second dielectric multilayer film (C− side) on the front side is smaller than the thickness of the first dielectric multilayer film (C+ side) on the rear side, the second dielectric multilayer film on the second end face works as the front side and a laser beam is emitted from this front side. The first dielectric multilayer film on the first end face works as the rear side and most of the laser beam is reflected by this rear side.

The method according to the second aspect of the present invention further comprises the step of, prior to forming the first and second dielectric multilayer films, determining plane orientations of the first and second end faces. This method allows the selection of the appropriate dielectric multilayer films for the respective end faces in accordance with the result of determination and allows the growth of the dielectric multilayer films on the respective end faces.

The method according to the second aspect of the present invention can be configured as follows: the step of forming the first and second end faces comprises: the step of forming the first and second end faces comprises the steps of scribing a first surface of the substrate product; and breaking the substrate product by press against a second surface of the substrate product to form a laser bar having the first and second end faces, the first and second end faces of the laser bar being formed by the breaking, the first surface being opposite to the second surface, the semiconductor region being provided between the first surface and the substrate, and each of the first and second end faces of the laser bar being included in a fractured face, and the fractured face extending from the first surface to the second surface and being formed by the breaking.

In this method, since the first and second end faces of the laser bar intersect with the reference plane defined by the normal axis to the primary surface and the a-axis or m-axis of the hexagonal III-nitride semiconductor, the first and second end faces can be formed as fractured faces by the scribe formation and press, and the fractured faces each extend from an edge of the first surface to an edge of the second surface.

The method according to the second aspect of the present invention can be configured so that the c-axis of the III-nitride semiconductor is inclined toward the direction of the m-axis of the nitride semiconductor. In another embodiment, the method according to the second aspect of the present invention can be configured so that the c-axis of the III-nitride semiconductor is inclined toward the direction of the a-axis of the nitride semiconductor.

The method according to the second aspect of the present invention can be configured so that the primary surface of the substrate is inclined in a range of not less than −4 degrees and not more than +4 degrees with respect to any one of {10-11}, {20-21}, {20-2-1}, and {10-1-1} planes. Furthermore, the method according to the second aspect of the present invention can be configured so that the primary surface of the substrate is any one of the {10-11} plane, {20-21} plane, {20-2-1} plane, and {10-1-1} plane.

In this method, when the c-axis of the III-nitride semiconductor is inclined toward the direction of the m-axis of the nitride semiconductor, practical plane orientations and angular range for the primary surface include at least the aforementioned plane orientations and angle range.

The method according to the second aspect of the present invention can be configured so that the primary surface of the substrate is inclined in the range of not less than −4 degrees and not more than +4 degrees from any one of {11-22}, {11-21}, {11-2-1}, and {11-2-2} planes. Furthermore, the method according to the second aspect of the present invention can be configured so that the primary surface of the substrate is any one of the {11-22} plane, {11-21} plane, {11-2-1} plane, and {11-2-2} plane.

In this substrate, when the c-axis of the III-nitride semiconductor is inclined toward the direction of the a-axis of the nitride semiconductor, practical plane orientations and angular range for the primary surface include at least the aforementioned plane orientations and angle range.

In the method according to the second aspect of the present invention, preferably, formation of the active layer comprises a step of growing a well layer of a strained gallium nitride-based semiconductor, and the strained gallium nitride-based semiconductor contains indium as a constituent element. In this method according to the second aspect of the present invention, the well layer is grown in the formation of the active layer and comprises strained InGaN, and this strain results from stress from and through a semiconductor layer adjacent to the well layer. In this method, the degradation of interest is observed in a GaN-based semiconductor containing indium as a Group III constituent element. The degree of degradation becomes more prominent with increase in the indium composition.

In the method according to the second aspect of the present invention, the active layer can be adapted to generate light at a wavelength of 430 to 550 nm. This method can provide the light in the aforementioned wavelength range by use of the well layer comprised of the strained GaN-based semiconductor containing indium as a constituent element.

In the method according to the second aspect of the present invention, preferably, the III-nitride semiconductor is GaN. In this method, for example, the emission of light in the aforementioned wavelength range (wavelength range from blue to green) can be provided by creation of the laser structure using the GaN primary surface.

In the method according to the second aspect of the present invention, a dielectric layer in the first dielectric multilayer film can be formed using at least one selected from silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide. A dielectric layer in the second dielectric multilayer film can be formed using at least one selected from silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide.

In this method, practical dielectric films can include silicon oxide (e.g., $SiO_2$), silicon nitride (e.g., $Si_3N_4$), silicon oxynitride (e.g., $SiO_xN_{1-x}$), titanium oxide (e.g., $TiO_2$), titanium nitride (e.g., TiN), titanium oxynitride (e.g., $TiO_xN_{1-x}$), zirconium oxide (e.g., $ZrO_2$), zirconium nitride (e.g., ZrN), zirconium oxynitride (e.g., $ZrO_xN_{1-x}$), zirconium fluoride (e.g., $ZrF_4$), tantalum oxide (e.g., $Ta_2O_5$), tantalum nitride (e.g., $Ta_3N_5$), tantalum oxynitride (e.g., $TaO_xN_{1-x}$), hafnium oxide (e.g., $HfO_2$), hafnium nitride (e.g., HfN), hafnium oxynitride (e.g., $HfO_xN_{1-x}$), hafnium fluoride (e.g., $HfF_4$), aluminum oxide (e.g., $Al_2O_3$), aluminum nitride (e.g., AlN), aluminum oxynitride (e.g., $AlO_xN_{1-x}$), magnesium fluoride (e.g., $MgF_2$), magnesium oxide (e.g., MgO), magnesium nitride (e.g., $Mg_3N_2$), magnesium oxynitride (e.g., $MgO_xN_{1-x}$), calcium fluoride (e.g., $CaF_2$), barium fluoride (e.g., $BaF_2$), cerium fluoride (e.g., $CeF_3$), antimony oxide (e.g., $Sb_2O_3$), bismuth oxide (e.g., $Bi_2O_3$), and gadolinium oxide (e.g., $Gd_2O_3$).

BRIEF DESCRIPTION OF THE DRAWINGS

The foregoing object and other objects, features, and advantages of the present invention can more readily become apparent in view of the following detailed description of the preferred embodiments of the present invention proceeding with reference to the accompanying drawings.

FIG. 6 is a drawing showing a {20-21} plane in a crystal lattice and showing a scanning electron microscopic image of an end face of the optical cavity.

| List of Reference Signs | |
|---|---|
| 11: | III-nitride semiconductor laser device; |
| 13: | laser structure; |
| 13a: | first surface; |
| 13b: | second surface; |
| 13c, 13d: | edges; |
| 15: | electrode; |
| 17: | support base; |
| 17a: | semipolar primary surface; |
| 17b: | backside of support base; |
| 17c: | end face of support base; |
| 19: | semiconductor region; |
| 19a: | top surface of semiconductor region; |
| 19c: | end face of semiconductor region; |
| 21: | first cladding layer; |
| 23: | second cladding layer; |
| 25: | active layer; |
| 25a | well layers; |
| 25b | barrier layers; |
| 27, 29: | fractured faces; |
| ALPHA: | angle; |

-continued

List of Reference Signs

| | |
|---|---|
| Sc: | c-plane; |
| NX: | normal axis; |
| 31: | insulating film; |
| 31a: | aperture of insulating film; |
| 35: | n-side optical guiding layer; |
| 37: | p-side optical guiding layer; |
| 39: | carrier block layer; |
| 41: | electrode; |
| 43a, 43b: | dielectric multilayer films; |
| MA: | m-axis vector; |
| BETA: | angle; |
| DSUB: | thickness of support base; |
| 51: | substrate; |
| 51a: | semipolar primary surface; |
| SP: | substrate product; |
| 57: | GaN-based semiconductor region; |
| 59: | light emitting layer; |
| 61: | GaN-based semiconductor region; |
| 53: | semiconductor region; |
| 54: | insulating film; |
| 54a: | aperture of insulating film; |
| 55: | laser structure; |
| 58a: | anode electrode; |
| 58b: | cathode electrode; |
| 63a: | first surface; |
| 63b: | second surface; |
| 10a: | laser scriber; |
| 65a: | scribed grooves; |
| 65b: | scribed groove; |
| LB: | laser beam; |
| SP1: | substrate product; |
| LB1: | laser bar; |
| 69: | blade; |
| 69a: | edge; |
| 69b, 69c: | blade faces; |
| 71: | support device; |
| 71a: | support surface; |
| 71b: | recess. |

DETAILED DESCRIPTION OF PREFERRED EMBODIMENTS

The expertise of the present invention can be readily understood in view of the following detailed description with reference to the accompanying drawings presented by way of illustration. Embodiments of the III-nitride semiconductor laser device and the method for fabricating the III-nitride semiconductor laser device is described with reference to the accompanying drawings. The same portions will be denoted by the same reference signs if possible.

Figure 1:
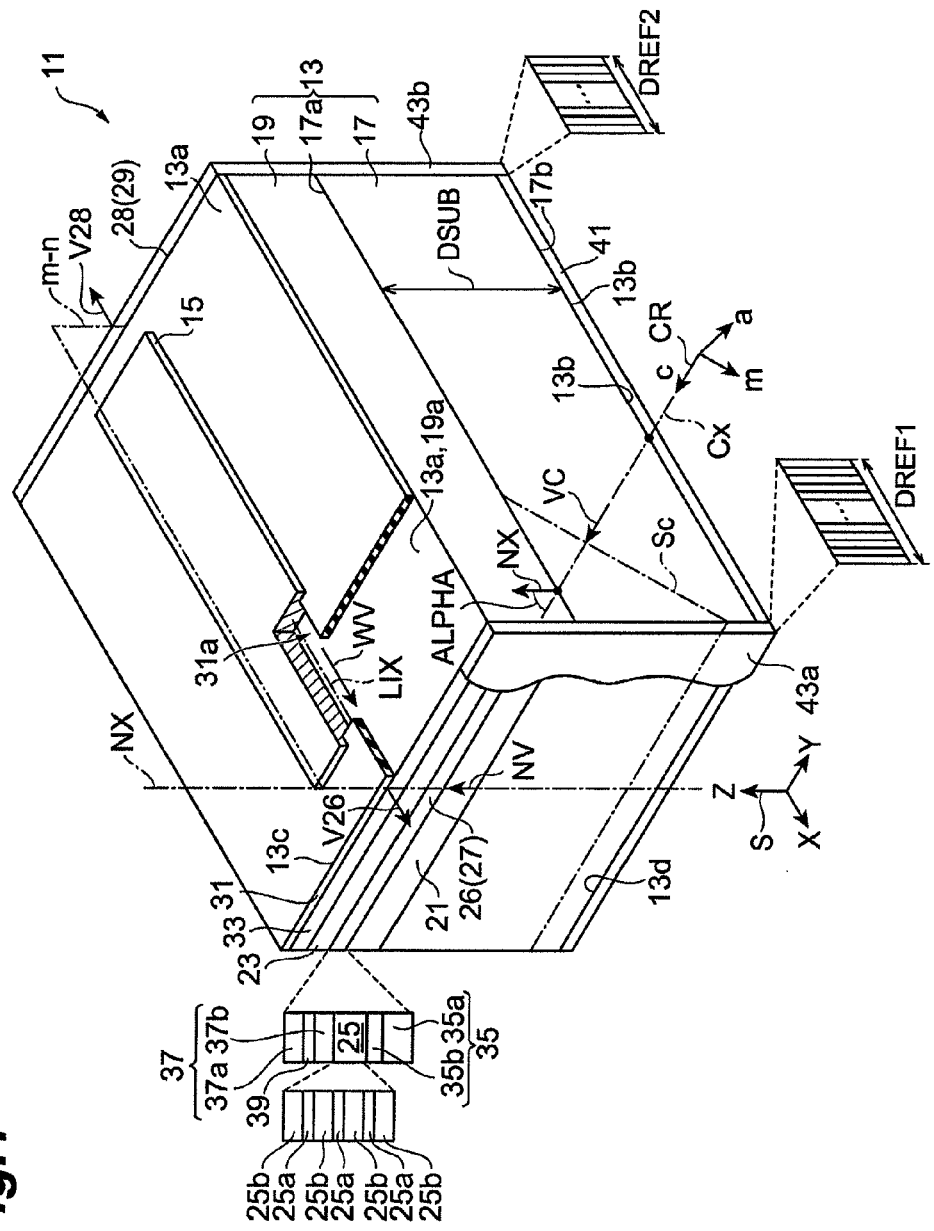
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has the gain guiding structure, but embodiments of the present invention are not limited to the gain guiding structure. The III-nitride semiconductor laser device 11 has a laser structure 13 and an electrode 15. The laser structure 13 includes a support base 17 and a semiconductor region 19. The support base 17 has a semipolar primary surface 17a, which comprises a hexagonal III-nitride semiconductor, and has a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 comprises a first conductivity type gallium nitride (GaN)-based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layer and this GaN-based semiconductor layers is provided for, for example, well layers 25a. The active layer 25 includes barrier layers 25b, which comprises a GaN-based semiconductor, and the well layers 25a and the barrier layers 25b are alternately arranged. The well layers 25a comprises, for example, InGaN or the like, and the barrier layers 25b comprises, for example, GaN, InGaN, or the like. The active layer 25 can include a quantum well structure provided to generate light at the wavelength of not less than 360 nm and not more than 600 nm. The use of the semipolar plane is suitable for generation of light at the wavelength of not less than 430 nm and not more than 550 nm. The first cladding layer 21, the second cladding layer 23, and the active layer 25 are arranged in the direction of an axis NX normal to the semipolar primary surface 17a. The normal axis NX extends in the direction of a normal vector NV. The c-axis Cx of the III-nitride semiconductor of the support base 17 extends in the direction of a c-axis vector VC.

The laser structure 13 includes a first end face 26 and a second end face 28 for an optical cavity. A waveguide for the optical cavity extends from the second end face 28 to the first end face 26, and a waveguide vector WV indicates a direction from the second end face 28 to the first end face 26. The first and second end faces 26 and 28 of the laser structure 13 intersect with a reference plane defined by the normal axis NX and a crystal axis of the hexagonal III-nitride semiconductor (m-axis or a-axis). In FIG. 1, the first and second end faces 26 and 28 intersect with an m-n plane, which is defined by the m-axis of the hexagonal III-nitride semiconductor and the normal axis NX. However, the first and second end faces 26 and 28 may intersect with an a-n plane, which is defined by the normal axis NX and the a-axis of the hexagonal III-nitride semiconductor.

With reference to FIG. 1, an orthogonal coordinate system S and a crystal coordinate system CR are depicted. The normal axis NX is directed in a direction of the Z-axis of the orthogonal coordinate system S. The semipolar primary surface 17a extends in parallel with a predetermined plane defined by the X-axis and Y-axis of the orthogonal coordinate system S. A typical c-plane Sc is also depicted in FIG. 1. A c+ axis vector indicating the direction of the <0001> axis of the III-nitride semiconductor of the support base 17 is inclined with respect to the normal vector NV toward a direction of either one crystal axis of the m-axis and a-axis of the III-nitride semiconductor. An angle of this inclination is in the range of not less than 45 degrees and not more than 80 degrees or in the range of not less than 100 degrees and not more than 135 degrees. In the present embodiment, the direction of the c+ axis vector is selected to be coincident with the direction of the vector VC. In the embodiment shown in FIG. 1, the c+ axis vector of the hexagonal III-nitride semiconductor of the support base 17 is inclined at an inclination angle ALPHA with respect to the normal axis NX toward the direction of the m-axis of the hexagonal III-nitride semiconductor. This angle ALPHA can be in the range of not less than 45 degrees and not more than 80 degrees or can be in the range of not less than 100 degrees and not more than 135 degrees.

The thickness DREF2 of a second dielectric multilayer film (C− side) 43b is smaller than the thickness DREF1 of a first dielectric multilayer film (C+ side) 43a. In the III-nitride semiconductor laser device 11, the c+ axis vector makes an acute angle with the waveguide vector WV, and this waveguide vector WV indicates a direction from the second end face 28 to the first end face 26. In this example, since the thickness of the second dielectric multilayer film 43b on the second end face (C– side) 28 is smaller than the thickness of the first dielectric multilayer film 43a on the first end face 26 (C+ side), the second dielectric multilayer film 43b forms a front side, and thus a laser beam is emitted from this front side. The first dielectric multilayer film 43a forms the rear side, and most of the laser beam is reflected by this rear side. When the thickness of the second dielectric multilayer film 43b on the front side is smaller than the thickness of the first dielectric multilayer film 43a on the rear side, reduction is achieved in the device degradation with progressive crystal quality deterioration which proceeds from the second end face due to the dielectric multilayer film on the end face and is associated with lifetime of the device.

The III-nitride semiconductor laser device 11 further has an insulating film 31. The insulating film 31 is provided on a top surface 19a of the semiconductor region 19 of the laser structure 13, and covers the top surface 19a. The semiconductor region 19 is located between the insulating film 31 and the support base 17. The support base 17 comprises the hexagonal III-nitride semiconductor. The insulating film 31 has an aperture 31a. The aperture 31a has, for example, a stripe shape. When the c-axis is inclined toward the direction of the m-axis as in the present embodiment, the aperture 31a extends along a direction of an intersecting line LIX between the top surface 19a of the semiconductor region 19 and the m-n plane mentioned above. The intersecting line LIX extends in the direction of the waveguide vector WV. If the c-axis is inclined toward the direction of the a-axis, the aperture 31a extends in a direction of another intersecting line LIX between the a-n plane and the top surface 19a.

The electrode 15 is in contact with the top surface 19a (e.g., second conductivity type contact layer 33) of the semiconductor region 19 through the aperture 31a, and extends along the direction of the aforementioned intersecting line LIX. In the III-nitride semiconductor laser device 11, the laser waveguide includes the first cladding layer 21, second cladding layer 23 and active layer 25, and extends along the direction of the aforementioned intersecting line LIX.

In the III-nitride semiconductor laser device 11, each of the first end face 26 and the second end face 28 can be a fractured face. In the subsequent description, the first end face 26, and the second end face 28 will be referred to as first fractured face 27 and second fractured face 29. The first fractured face 27 and the second fractured face 29 intersect with the m-n plane that is defined by the normal axis NX and the m-axis of the hexagonal III-nitride semiconductor. The optical cavity of the III-nitride semiconductor laser device 11 includes the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. Each of the first and second fractured faces 27 and 29 extends from an edge 13c of the first surface 13a to an edge 13d of the second surface 13b. The first and second fractured faces 27 and 29 are different from the conventional cleaved facets, such as c-plane, m-plane, or a-plane.

In this III-nitride semiconductor laser device 11, the first and second fractured faces 27 and 29 constituting the optical cavity intersect with the m-n plane. For this reason, it is feasible to provide the laser waveguide extending in the direction of the intersecting line between the m-n plane and the semipolar plane 17a. Therefore, the III-nitride semiconductor laser device 11 has the optical cavity enabling a low threshold current.

The III-nitride semiconductor laser device 11 includes an n-side optical guiding layer 35 and a p-side optical guiding layer 37. The n-side optical guiding layer 35 includes a first part 35a and a second part 35b, and the n-side optical guiding layer 35 comprises, for example, GaN, InGaN, or the like. The p-side optical guiding layer 37 includes a first part 37a and a second part 37b, and the p-side optical guiding layer 37 comprises, for example, GaN, InGaN, or the like. A carrier block layer 39 is provided, for example, between the first part 37a and the second part 37b. Another electrode 41 is provided on the back surface 17b of the support base 17, and the electrode 41 covers, for example, the back surface 17b of the support base 17.

Figure 2:
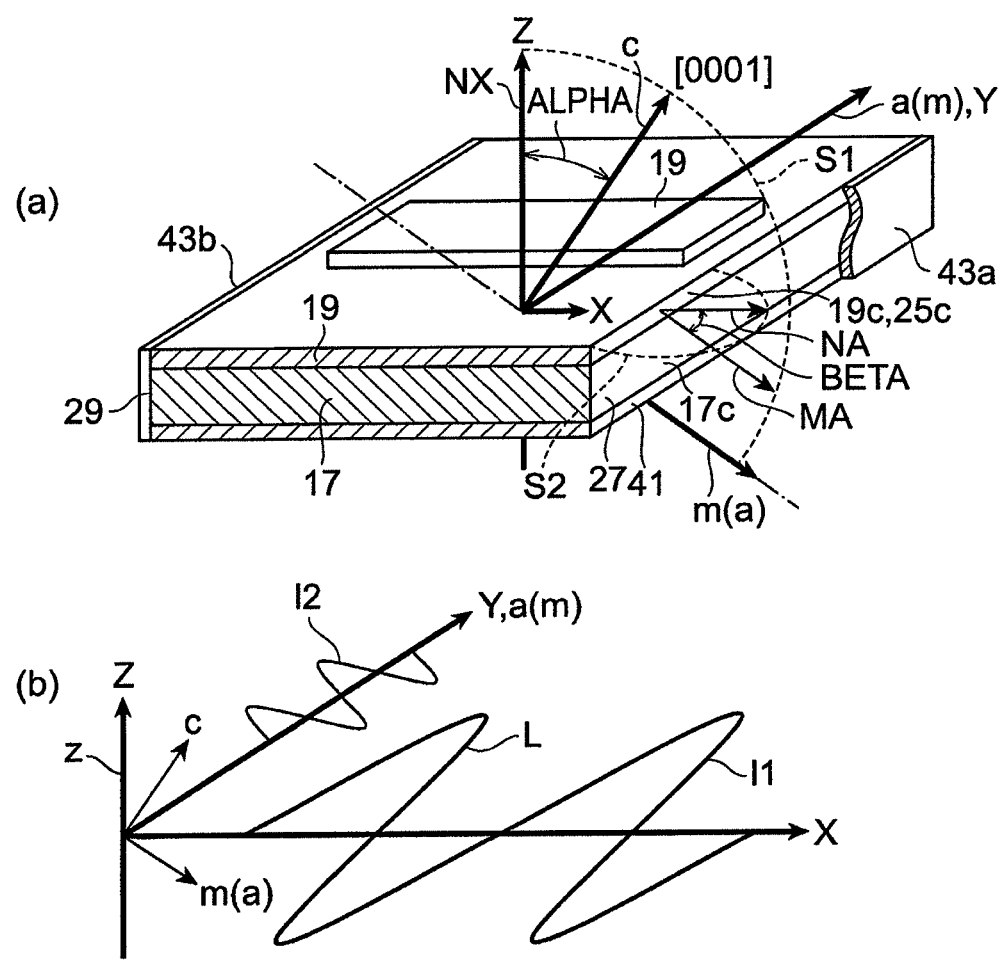
FIG. 2 is a drawing showing polarization of emission in an active layer of the III-nitride semiconductor laser device.
Figure 3:
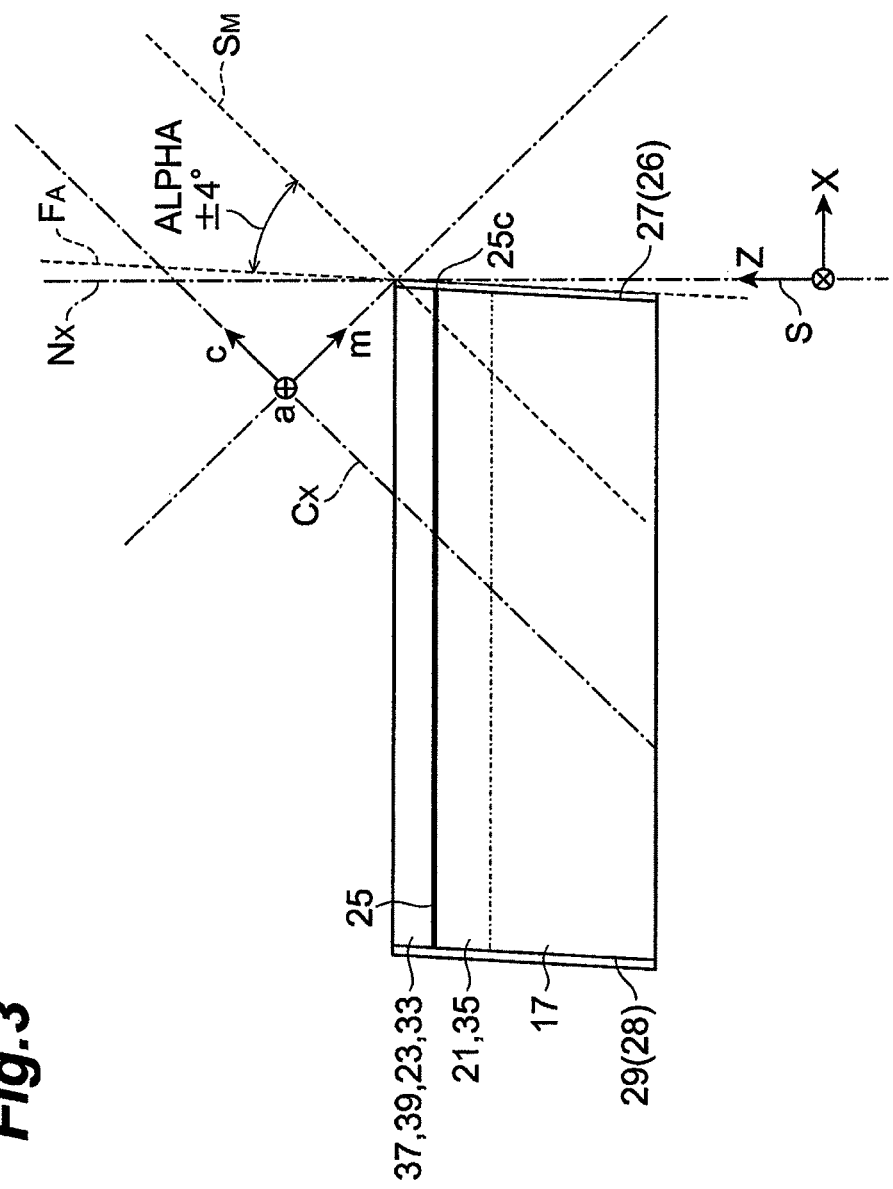
FIG. 3 is a drawing showing relations between end faces of the III-nitride semiconductor laser device and an m-plane in the active layer.

FIG. 2 is a drawing showing polarization of emission from the active layer 25 of the III-nitride semiconductor laser device 11. FIG. 3 is a drawing schematically showing a cross section defined by the c-axis and the m-axis. As shown in FIG. 2, the dielectric multilayer films 43a and 43b are provided on the first and second fractured faces 27 and 29, respectively. Material of each of the dielectric multilayer films 43a and 43b can comprise at least one selected, for example, from silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide. In this III-nitride semiconductor laser device 11, a practical dielectric film can be made of at least one of silicon oxide (e.g., $SiO_2$), silicon nitride (e.g., $Si_3N_4$), silicon oxynitride (e.g., $SiO_xN_{1-x}$), titanium oxide (e.g., $TiO_2$), titanium nitride (e.g., TiN), titanium oxynitride (e.g., $TiO_xN_{1-x}$), zirconium oxide (e.g., $ZrO_2$), zirconium nitride (e.g., ZrN), zirconium oxynitride (e.g., $ZrO_xN_{1-x}$), zirconium fluoride (e.g., $ZrF_4$), tantalum oxide (e.g., $Ta_2O_5$), tantalum nitride (e.g., $Ta_3N_5$), tantalum oxynitride (e.g., $TaO_xN_{1-x}$), hafnium oxide (e.g., $HfO_2$), hafnium nitride (e.g., HfN), hafnium oxynitride (e.g., $HfO_xN_{1-x}$), hafnium fluoride (e.g., $HfF_4$), aluminum oxide (e.g., $Al_2O_3$), aluminum nitride (e.g., AlN), aluminum oxynitride (e.g., $AlO_xN_{1-x}$), magnesium fluoride (e.g., $MgF_2$), magnesium oxide (e.g., MgO), magnesium nitride (e.g., $Mg_3N_2$), magnesium oxynitride (e.g., $MgO_xN_{1-x}$), calcium fluoride (e.g., $CaF_2$), barium fluoride (e.g., $BaF_2$), cerium fluoride (e.g., $CeF_3$), antimony oxide (e.g., $Sb_2O_3$), bismuth oxide (e.g., $Bi_2O_3$), and gadolinium oxide (e.g., $Gd_2O_3$). By making use of these materials, an end face coating is also applicable to the fractured faces 27 and 29. The reflectance can be adjusted by the end face coating. When the reflectance of the second dielectric multilayer film (C– side) 43b is smaller than the reflectance of the first dielectric multilayer film (C+ side) 43a, this controlling of the reflectance enables reduction to be achieved in the device degradation with deterioration of crystal quality, concerning the device lifetime, that proceeds from the second end face due to the dielectric multilayer film thereon.

As shown in part (b) of FIG. 2, the laser beam L from the active layer 25 is polarized in the direction of the a-axis of the hexagonal III-nitride semiconductor. In this III-nitride semiconductor laser device 11, an inter-band transition capable of demonstrating a low threshold current can generate light with polarized nature. The first and second fractured faces 27 and 29 for the optical cavity are different from the conventional cleaved facets, such as c-plane, m-plane and a-plane. However, the first and second fractured faces 27 and 29 have flatness and verticality as mirrors enough for optical cavities for lasers. This optical cavity can demonstrate lasing with a low threshold by use of emission I1 based on a stronger transition than emission I2 based on a transition that generates light polarized in a direction of the projected c-axis onto the primary surface, as shown in part (b) of FIG. 2, using the first and second fractured faces 27 and 29 and the laser waveguide extending between these fractured faces 27 and 29.

In the III-nitride semiconductor laser device 11, an end face 17c of the support base 17 and an end face 19c of the semiconductor region 19 are exposed in each of the first and second fractured faces 27 and 29, and the end face 17c and the end face 19c are covered with a dielectric multilayer film 43a. An angle BETA between an m-axis vector MA of the active layer 25 and a vector NA normal to an end face 25c of the active layer 25 and the end face 17c of the support base 17 is defined by a component $(BETA)_1$, which is defined on a first plane S1 defined by the c-axis and m-axis of the III-nitride semiconductor, and a component $(BETA)_2$, which is defined on a second plane S2 perpendicular to the first plane S1 and the normal axis NX. The component $(BETA)_1$ is preferably in the range of not less than (ALPHA−4) degrees and not more than (ALPHA+4) degrees on the first plane S1 that is defined by the c-axis and m-axis of the III-nitride semiconductor. This angular range is shown as an angle between a typical m-plane $S_M$ and a reference plane $F_A$ in FIG. 3. For easier understanding, the typical m-plane $S_M$ is depicted from the inside to the outside of the laser structure in FIG. 3. The reference plane $F_A$ extends along the end face 25c of the active layer 25. This III-nitride semiconductor laser device 11 has the end faces satisfying the above-mentioned verticality as to the angle BETA taken from one of the c-axis and the m-axis to the other. Furthermore, the component $(BETA)_2$ is preferably in the range of not less than −4 degrees and not more than +4 degrees on the second plane S2. It is noted herein that $BETA^2=(BETA)_1^2+(BETA)_2^2$. In this case, the end faces 27 and 29 of the III-nitride semiconductor laser device 11 satisfy the above-mentioned verticality about the angle defined on the plane perpendicular to the normal axis NX to the semipolar plane 17a.

Referring again to FIG. 1, the thickness DSUB of the support base 17 is preferably not more than 400 μm in the III-nitride semiconductor laser device 11. This III-nitride semiconductor laser device is suitable for obtaining the good-quality fractured faces for the optical cavity. In the III-nitride semiconductor laser device 11, the thickness DSUB of the support base 17 is more preferably not less than 50 μm and not more than 100 μm. This III-nitride semiconductor laser device 11 is more suitable for obtaining the good-quality fractured faces for the optical cavity, and the handling of the III-nitride semiconductor laser device 11 becomes easier to improve production yield.

In the III-nitride semiconductor laser device 11, the angle ALPHA between the normal axis NX and the c-axis of the hexagonal III-nitride semiconductor is preferably not less than 45 degrees and preferably not more than 80 degrees, and the angle ALPHA is preferably not less than 100 degrees and not more than 135 degrees. At angles below 45 degrees and above 135 degrees, end faces made by press are highly likely to be composed of m-planes. At angles above 80 degrees and below 100 degrees, its desired flatness and verticality could not be achieved.

In the III-nitride semiconductor laser device 11, in terms of formation of the fractured faces, the angle ALPHA between the normal axis NX and the c-axis of the hexagonal III-nitride semiconductor is more preferably not less than 63 degrees and not more than 80 degrees. Furthermore, the angle ALPHA is preferably not less than 100 degrees and not more than 117 degrees. At angles below 63 degrees and above 117 degrees, an m-plane can appear in part of an end face formed by press. The angle ALPHA in an angle above 80 degrees and below 100 degrees can provide the end faces with desired flatness and verticality.

In the III-nitride semiconductor laser device 11, when the c-axis of the III-nitride semiconductor is inclined toward the direction of the m-axis of the nitride semiconductor, practical plane orientations and angular range include at least the following plane orientations and angular range for the primary surface. For example, the primary surface 17a of the support base 17 can be inclined in the range of not less than −4 degrees and not more than 4 degrees from any one of a {10-11} plane, a {20-21} plane, a {20-2-1} plane, and a {10-1-1} plane. Furthermore, the primary surface 17a of the support base 17 can be any one of the {10-11} plane, {20-21} plane, {20-2-1} plane, and {10-1-1} plane.

In the III-nitride semiconductor laser device 11, when the c-axis of the III-nitride semiconductor is inclined toward the direction of the a-axis of the nitride semiconductor, practical plane orientations and angular range for the primary surface include at least the following plane orientations and angular range. The primary surface 17a of the support base 17 can be inclined in the range of not less than −4 degrees and not more than 4 degrees from any one of a {11-22} plane, a {11-21} plane, a {11-2-1} plane, and a {11-2-2} plane. Furthermore, the primary surface 17a of the support base 17 can be any one of the {11-22} plane, {11-21} plane, {11-2-1} plane, and {11-2-2} plane.

With these typical semipolar planes 17a, it is feasible to provide the first and second end faces 26 and 28 with flatness and verticality enough to constitute the optical cavity of the III-nitride semiconductor laser device 11. In the range of angles encompassing the above typical plane orientations, the end faces with sufficient flatness and verticality are obtained. The second dielectric multilayer film (C− side) 43b having a thickness smaller than that of the first dielectric multilayer film (C+ side) 43a can avoid the degradation of the device lifetime due to the dielectric multilayer film. The second dielectric multilayer film (C-side) 43b having a reflectance smaller than that of the first dielectric multilayer film (C+ side) 43a can avoid the degradation of the device lifetime due to the dielectric multilayer film.

The support base 17 can be constituted by any one of GaN, AlGaN, InGaN, and InAlGaN. When the substrate is composed of any one of these GaN-based semiconductors, it is feasible to obtain the fractured faces 27 and 29 applicable to the optical cavity.

The support base 17 can be made of GaN. In this III-nitride semiconductor laser device, provision of the laser structure using the GaN primary surface leads to provision of emission, for example, in the aforementioned wavelength range (wavelength range from blue to green). When an AlN or AlGaN substrate is used as the substrate, the degree of polarization can be increased and optical confinement can be enhanced by its low refractive index. When an InGaN substrate is used as the substrate, the lattice mismatch rate between the substrate and the light emitting layer can be decreased to improve its crystal quality. In the III-nitride semiconductor laser device 11, the stacking fault density of the support base 17 can be not more than $1\times10^4$ cm$^{-1}$. Since the stacking fault density is not more than $1\times10^4$ cm$^{-1}$, the flatness and/or verticality of the fractured faces is less likely to be disordered for an accidental reason.

Figure 4:
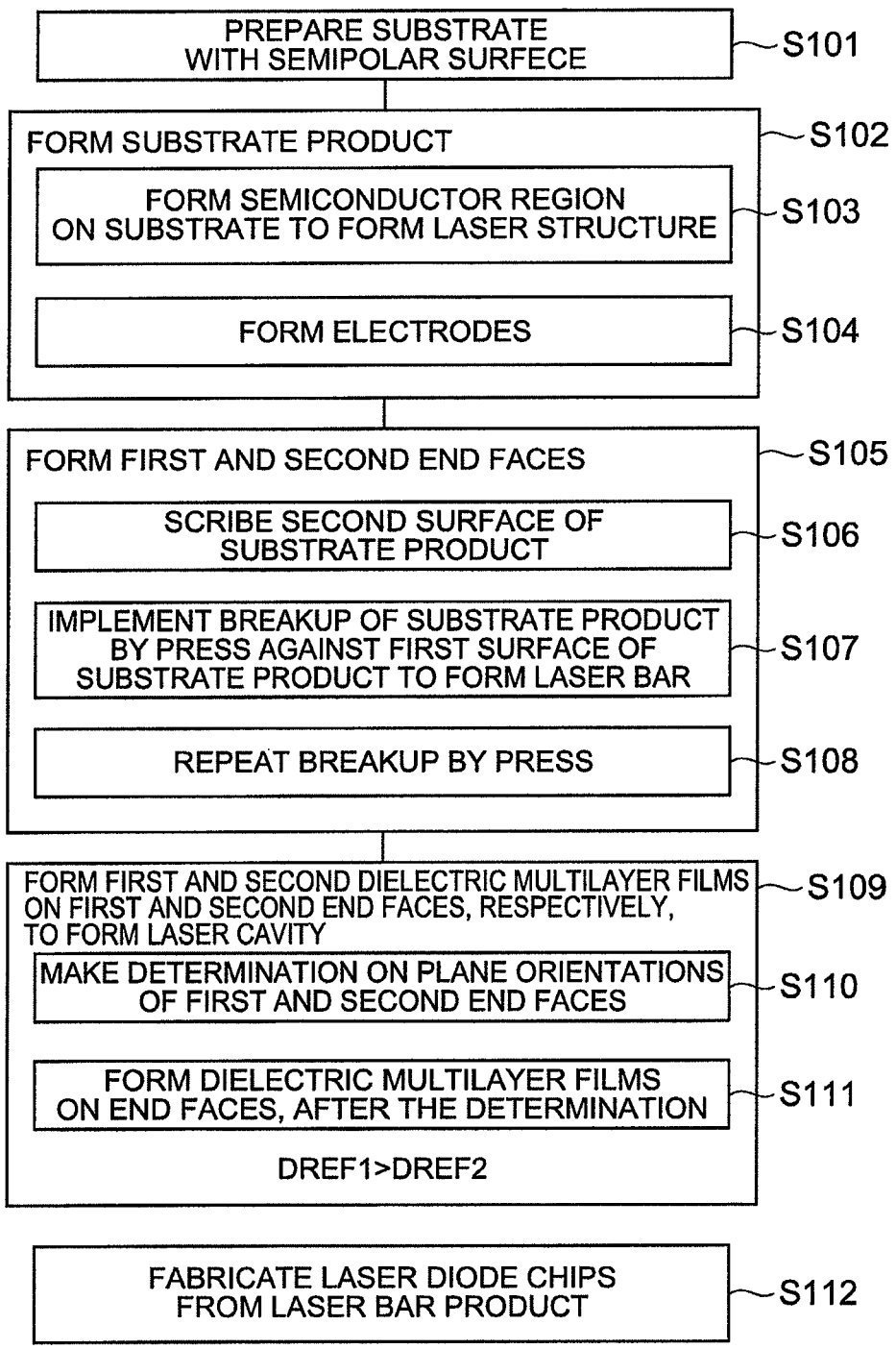
FIG. 4 is a fabrication flowchart showing major steps in a method of fabricating a III-nitride semiconductor laser device according to an embodiment.

FIG. 4 is a drawing showing major steps in a method of fabricating a III-nitride semiconductor laser device according to an embodiment of the present invention. Referring to part (a) of FIG. 5, a substrate 51 is shown. The c-axis of the substrate 51 is inclined toward the direction of the m-axis in the present embodiment, but the present fabrication method is also applicable to the substrate 51 the c-axis of which is inclined toward the direction of the a-axis. In Step S101 the substrate is prepared 51 for fabrication of the III-nitride semiconductor laser device. The c-axis (vector VC) of a hexagonal III-nitride semiconductor of the substrate 51 is inclined at the angle ALPHA with respect to the normal axis NX toward the m-axis direction (vector VM) of the hexagonal III-nitride semiconductor. For this reason, the substrate 51 has a semipolar primary surface 51a comprised of the hexagonal III-nitride semiconductor.

In Step S102, a substrate product SP is formed. Although a member of nearly a disk shape is depicted as the substrate product SP in part (a) of FIG. 5, the shape of the substrate product SP is not limited thereto. For obtaining the substrate product SP, step S103 is first carried out to form a laser structure 55. The laser structure 55 includes a semiconductor region 53 and the substrate 51, and in step S103, the semiconductor region 53 is formed on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, optical guiding layers, an electron block layer, and so on. The GaN-based semiconductor region 57, the light emitting layer 59, and the second conductivity type GaN-based semiconductor region 61 are arranged in the direction of the axis NX normal to the semipolar primary surface 51a. These semiconductor layers are epitaxially grown on the primary surface 51a. The top surface of the semiconductor region 53 is covered with an insulating film 54. The insulating film 54 is made, for example, of silicon oxide. The insulating film 54 has an aperture 54a. The aperture 54a has, for example, a stripe shape. Referring to part (a) of FIG. 5, a waveguide vector WV is depicted, and in the present embodiment, this vector WV extends in parallel with the m-n plane. If necessary, prior to formation of the insulating film 54, a ridge structure may be formed in the semiconductor region 53, and this ridge structure can include the GaN-based semiconductor region 61 which is processed in a ridge shape.

In step S104, an anode electrode 58a and a cathode electrode 58b are formed on the laser structure 55. Before formation of the electrode on the back surface of the substrate 51, the back surface of the substrate used in the crystal growth is polished to form the substrate product SP having a desired thickness DSUB. In the formation of electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. Through these steps, the substrate product SP is formed. The substrate product SP includes a first surface 63a and a second surface 63b which is opposite thereto. The semiconductor region 53 is located between the first surface 63a and the substrate 51.

Next, in step S105, the end faces for the optical cavity for laser is formed. In the present embodiment, a laser bar is produced from the substrate product SP. The laser bar has a pair of end faces on which a dielectric multilayer film can be formed. An example of production of the laser bar and end faces will be described below.

Figure 5:
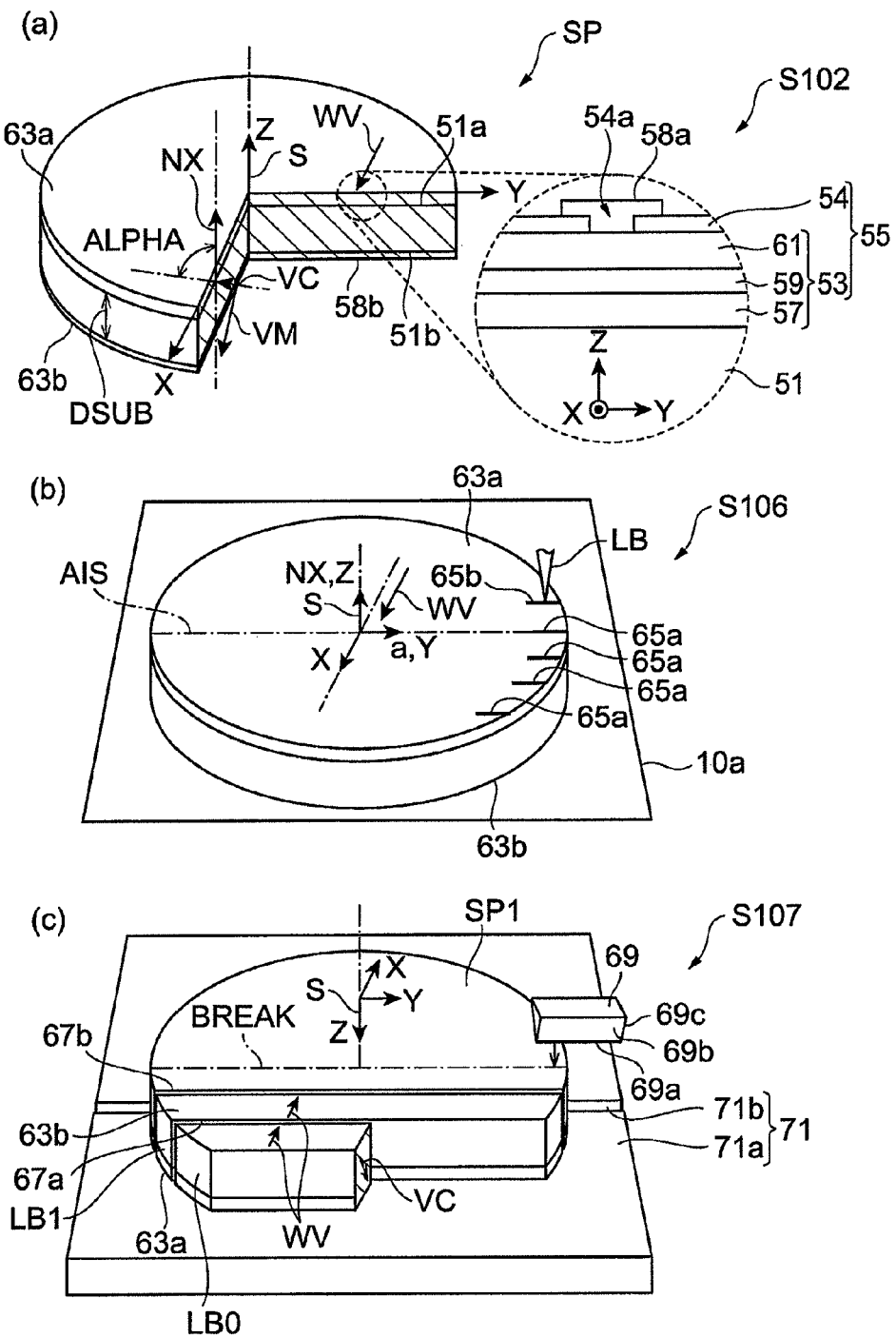
FIG. 5 is a drawing schematically showing major steps in the method of fabricating the III-nitride semiconductor laser device according to the embodiment.

In step S106, the first surface 63a of the substrate product SP is scribed as shown in part (b) of FIG. 5. This scribing is carried out using a laser scriber 10a. The scribing forms scribed grooves 65a. Referring to part (b) of FIG. 5, five scribed grooves are already formed, and formation of a scribed groove 65b is under way with a laser beam LB. The length of the scribed grooves 65a is smaller than a length of an intersecting line AIS defined by the intersection between the first surface 63a and the a-n plane, which is defined by the normal axis NX and the a-axis of the hexagonal III-nitride semiconductor, and the laser beam LB is applied to a part of the intersecting line MS. With application of the laser beam LB, a groove extending in the specific direction and reaching the semiconductor region is formed in the first surface 63a. The scribed grooves 65a can be formed, for example, at one edge of the substrate product SP.

In step S107, as shown in part (c) of FIG. 5, the substrate product SP is broken by press against the second surface 63b of the substrate product SP to form a substrate product SP1 and a laser bar LB1. The press is implemented, for example, with a breaking device such as blade 69. The blade 69 includes an edge 69a extending in one direction and at least two blade faces 69b and 69c that define the edge 69a. Furthermore, the press against the substrate product SP1 is carried out on a support device 71. The support device 71 includes a support surface 71a and a recess 71b, and the recess 71b extends in one direction. The recess 71b is provided in the support surface 71a. The substrate product SP1 is positioned with respect to the recess 71b on the support device 71 such that the orientation and position of the scribed groove 65a of the substrate product SP1 are aligned with the extending direction of the recess 71b of the support device 71. The orientation of the edge of the breaking device is aligned with the extending direction of the recess 71b, and the edge of the breaking device is then moved to the substrate product SP1 from a direction intersecting with the second surface 63b, to be in contact with the substrate product SP1. The intersecting direction is preferably an approximately perpendicular direction to the second surface 63b. The substrate product SP is broken by this press work to form the substrate product SP1 and laser bar LB1. The laser bar LB1 with first and second end faces 67a and 67b is formed by the press, and in these end faces 67a and 67b, at least a part of the light emitting layer has the verticality and flatness enough to be applicable to the optical cavity mirrors of the semiconductor laser.

The laser bar LB1 thus formed has the first and second end faces 67a and 67b formed by the above-described breaking work, and each of the end faces 67a and 67b extends from the first surface 63a to the second surface 63b. For this reason, the end faces 67a and 67b constitute the laser optical cavity of the III-nitride semiconductor laser device and intersect with the XZ plane. This XZ plane corresponds to the m-n plane defined by the m-axis of the hexagonal III-nitride semiconductor and the normal axis NX. A waveguide vector WV is shown in each of laser bars LB0 and LB1. The waveguide vector WV is directed in the direction from the end face 67a to the end face 67b. In part (c) of FIG. 5, the laser bar LB0 is depicted which is partly broken in order to show the direction of the c-axis vector VC. The waveguide vector WV makes an acute angle with the c-axis vector VC.

In this method, the first surface 63a of the substrate product SP is first scribed in the direction of the a-axis of the hexagonal III-nitride semiconductor, and thereafter the substrate product SP is broken by press against the second surface 63b of the substrate product SP to form a new substrate product SP1 and a new laser bar LB1. Accordingly, the first and second end faces 67a and 67b are formed in the laser bar LB1 so as to intersect with the m-n plane. This end-face forming method provides the first and second end faces 67a and 67b with flatness and verticality enough to constitute the laser cavity for the III-nitride semiconductor laser device. The laser waveguide thus formed extends in the direction toward which the c-axis of the hexagonal III-nitride is inclined. This method forms mirror end faces for the optical cavity capable of providing this laser waveguide.

By this method, the new substrate product SP1 and laser bar LB1 are formed by fracture of the substrate product. In Step S108, the breaking by press is repeated to produce many laser bars. This fracture is induced with the scribed grooves 65a shorter than a fracture line BREAK of the laser bar LB1.

In step S109, a dielectric multilayer film is formed on the end faces 67a and 67b of the laser bar LB1 to form a laser bar product. This step is carried out, for example, as follows. Step S110 is carried out to determine plane orientations of the end faces 67a and 67b of the laser bar LB1. This determination can be made, for example, by measuring the orientation of the c+ axis vector. Alternatively, the determination can also be made, for example, by carrying out the following process and/or operation to associate the end faces 67a and 67b with the direction of the c+ axis vector in production of the end faces 67a and 67b: a mark indicative of the direction of the c+ axis vector is formed on the laser bar; and/or the produced laser bar is arranged so as to indicate the direction of the c+ axis vector. After the determination, in the laser bar LB1 an angle between a normal vector normal to the second end face 67b, and the c+ axis vector is larger than an angle between a normal vector to the first end face 67a and the c+ axis vector.

After the determination, step S111 is carried out to form a dielectric multilayer film on each of the end faces 67a and 67b of the laser bar LB1. According to this method, the direction of the waveguide vector WV making the acute angle with the c+ axis vector corresponds to the direction from the second end face 67a to the first end face 67b in the laser bar LB1. In this laser bar product, since the thickness DREF2 of the second dielectric multilayer film (C-) on the second end face 67a is made smaller than the thickness DREF1 of the first dielectric multilayer film (C+) on the first end face 67b, it is feasible to reduce the device degradation with deterioration of crystal quality proceeding from the second end face due to the dielectric multilayer film on the end face and thus to avoid reduction in device lifetime. When the thickness of the second dielectric multilayer film (C-) on the front side is smaller than the thickness of the first dielectric multilayer film (C+) on the rear side, the second dielectric multilayer film on the second end face is provided for the front side and a laser beam is emitted from this front side. The first dielectric multilayer film on the first end face is provided for the rear side, and most of the laser beam is reflected by this rear side.

In Step S112, this laser bar product is broken into individual semiconductor laser dies.

In the fabrication method according to the present embodiment, the angle ALPHA can be in the range of not less than 45 degrees and not more than 80 degrees or in the range of not less than 100 degrees and not more than 135 degrees. At angles below 45 degrees and above 135 degrees, an end face formed by press is highly likely to be comprised of an m-plane. At angles above 80 degrees and below 100 degrees, the desired flatness and verticality could not be achieved. More preferably, the angle ALPHA can be in the range of not less than 63 degrees and not more than 80 degrees and in the range of not less than 100 degrees and not more than 117 degrees. At angles below 63 degrees and above 117 degrees, an m-plane could be formed in part of an end face formed by press. At angles above 80 degrees and below 100 degrees, the desired flatness and verticality could not be achieved. The semipolar primary surface 51a can be any one of a {20-21} plane, a {10-11} plane, a {20-2-1} plane, and a {10-1-1} plane; or, when the c-axis is inclined toward the direction of the a-axis, the semipolar primary surface 51a can be any one of a {11-22} plane, a {11-21} plane, a {11-2-1} plane, and a {11-2-2} plane. Furthermore, a plane slightly inclined with respect to the above planes in the range of not less than −4 degrees and not more than +4 degrees is also suitably applicable to the foregoing primary surface. With these typical semipolar planes, it is feasible to provide the end faces for the laser cavity with flatness and verticality enough to constitute the laser cavity of the III-nitride semiconductor laser device.

The substrate 51 can be composed of any one of GaN, AlGaN, InGaN, and InAlGaN. When the substrate used is one comprised of any one of these GaN-based semiconductors, it is feasible to obtain the end faces applicable to the laser cavity. The substrate 51 is preferably made of GaN.

In the step S106 in which the substrate product SP is formed, the semiconductor substrate used in the crystal growth is subjected to processing such as slicing or grinding so that the substrate thickness becomes not more than 400 μm, and the second surface 63b can include a processed surface formed by polishing. In this substrate thickness, the use of fracture permits the flatness and verticality, with a good yield, enough to constitute the laser optical cavity of the III-nitride semiconductor laser device. The use of fracture allows formation of the end faces 67a and 67b that are not subjected to any ion damages. More preferably, the second surface 63b is a polished surface made by polishing, and the thickness of the polished substrate is not more than 100 μm. For easier handling of the substrate product SP, the substrate thickness is preferably not less than 50 μm. If the fracture is not used, then the end faces can be, for example, etched faces made by etching and this light emitting layer has end faces exposed at the etched faces.

In the production method of the laser end faces according to the present embodiment, the angle BETA, which was described with reference to FIG. 2, can be also defined in the laser bar LB1. In the laser bar LB1, the component $(BETA)_1$ of the angle BETA is preferably in the range of not less than (ALPHA−4) degrees and not more than (ALPHA+4) degrees on a first plane (plane corresponding to the first plane S1 shown with reference to FIG. 2) defined by the c-axis and m-axis of the III-nitride semiconductor. The end faces 67a and 67b of the laser bar LB1 satisfy the aforementioned verticality as to the angle component of the angle BETA taken from one of the c-axis and the m-axis to the other. The component $(BETA)_2$ of the angle BETA is preferably in the range of not less than −4 degrees and not more than +4 degrees on a second plane (plane corresponding to the second plane S2 shown in FIG. 2). In this case, the end faces 67a and 67b of the laser bar LB1 satisfy the aforementioned verticality as to the angle component of the angle BETA defined on the plane normal to the axis NX normal to the semipolar plane 51a.

The end faces 67a and 67b are formed by the breaking process by press onto the plurality of GaN-based semiconductor layers that are epitaxially grown on the semipolar plane 51a. Since the semiconductor layers are made of the epitaxial films on the semipolar plane 51a, the end faces 67a and 67b are not cleaved facets with a low plane index such as c-plane, m-plane, or a-plane having been used heretofore as optical cavity mirrors. In breaking the laminate of the epitaxial films on the semipolar plane 51a, however, the end faces 67a and 67b have the flatness and verticality applicable to the optical cavity mirrors.

Example 1

A laser diode is grown by organometallic vapor phase epitaxy as described below. Raw materials used are as follows: trimethyl gallium (TMGa); trimethyl aluminum (TMAl); trimethyl indium (TMIn); ammonia ($NH_3$); silane ($SiH_4$); and bis(cyclopentadienyl) magnesium ($Cp_2Mg$). A substrate 71 is prepared, which is a {20-21} GaN substrate. This GaN substrate is fabricated by cutting a (0001) GaN ingot, grown thick by HYPE, with a wafer slicing apparatus at an angle of 75 degrees with respect to the m-axis direction.

Figure 7:
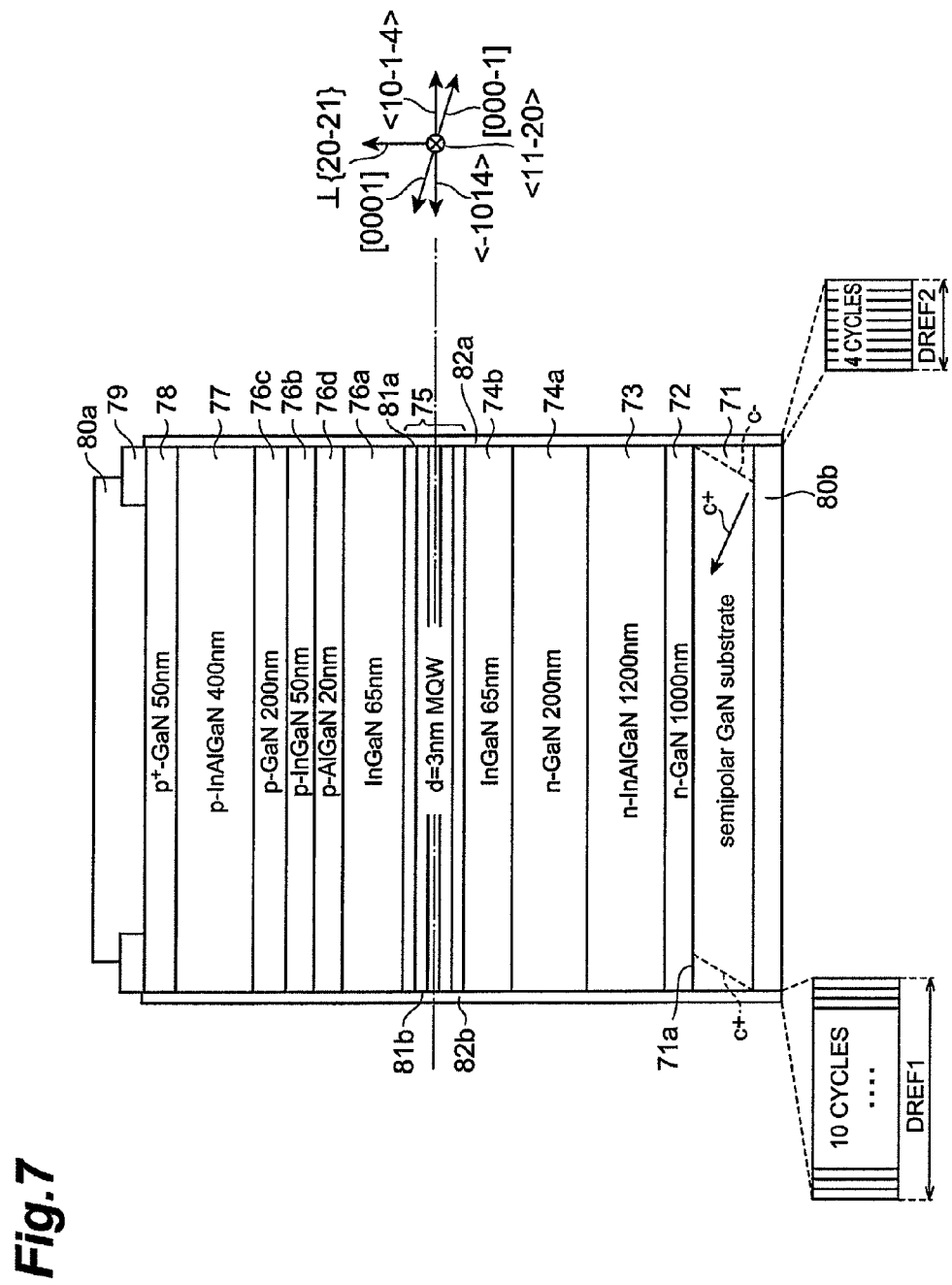
FIG. 7 is a drawing showing a structure of a laser diode shown in Example 1.
Figure 8:
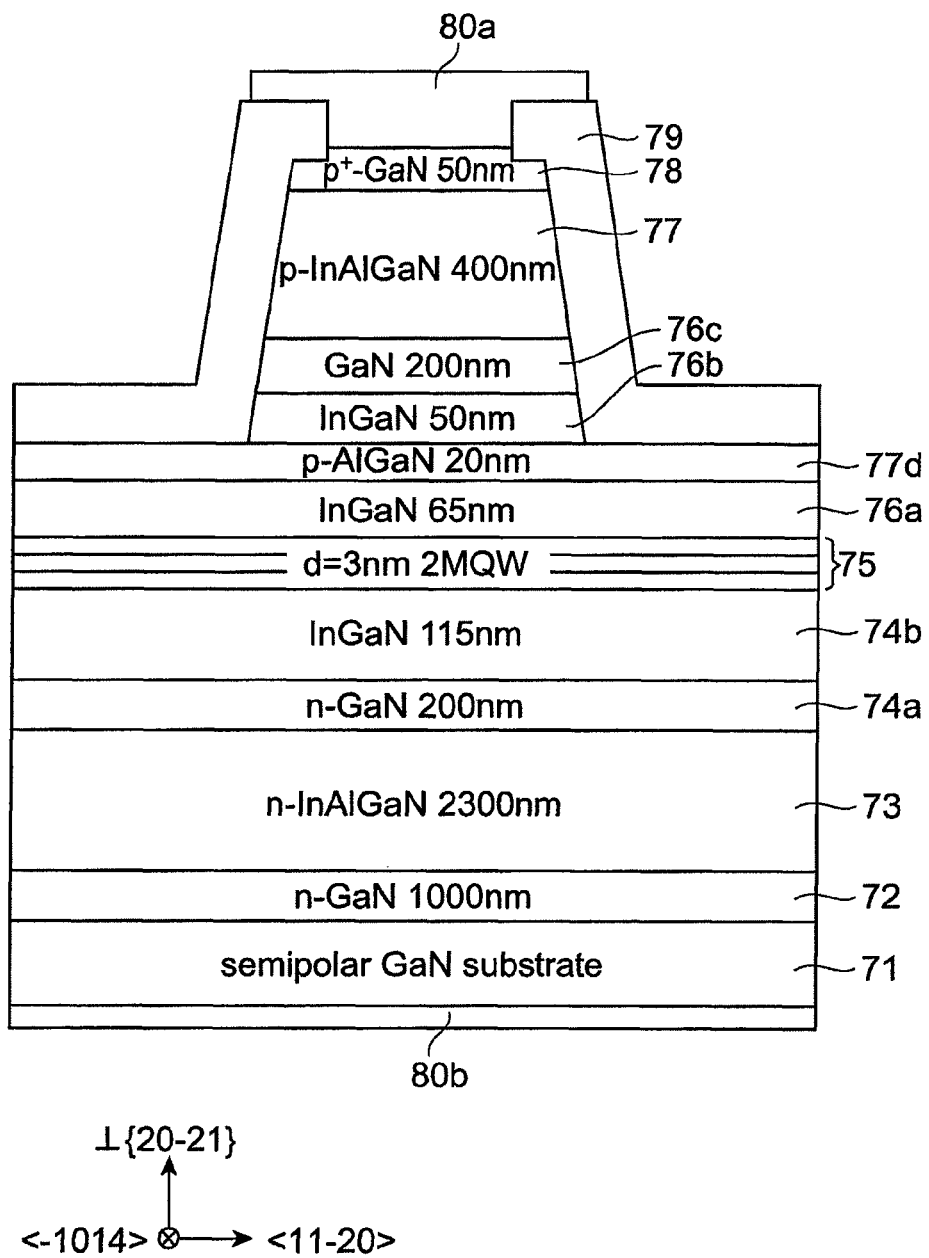
FIG. 8 is a drawing showing the structure of the laser diode shown in Example 1.

This substrate is loaded into a susceptor in a growth reactor, and thereafter epitaxial layers for the laser structure shown in FIG. 7 are grown through the following growth procedure. After the substrate 71 is set in the growth reactor, an n-type GaN layer (thickness: 1000 nm) 72 is first grown on the substrate 71. Next, an n-type InAlGaN cladding layer (thickness: 1200 nm) 73 is grown on the n-type GaN layer 72. Subsequently, the light emitting layer is formed. First, an n-type GaN guiding layer (thickness: 200 nm) 74a and an undoped InGaN guiding layer (thickness: 65 nm) 74b are grown on the n-type InAlGaN cladding layer 73. Next, an active layer 75 is grown. This active layer 75 has a multiple quantum well structure (MQW) of two cycles of GaN (thickness: 15 nm)/InGaN (thickness: 3 nm). Thereafter, an undoped InGaN guiding layer (thickness: 65 nm) 76a, a p-type AlGaN block layer (thickness: 20 nm) 76d, a p-type InGaN guiding layer (thickness: 50 nm) 76b, and a p-type GaN guiding layer (thickness: 200 nm) 76c are grown on the active layer 75. Next, a p-type InAlGaN cladding layer (thickness: 400 nm) 77 is grown on the light emitting layer. Finally, a p-type GaN contact layer (thickness: 50 nm) 78 is grown on the p-type InAlGaN cladding layer 77.

Using this epitaxial substrate, an index guiding type laser is fabricated by photolithography and etching. First, a stripe mask is formed by photolithography, and the mask extends in a direction of the projected c-axis onto the primary surface. Using this mask, a striped ridge structure in the width of 2 μm is formed by dry etching. The dry etching is carried out, for example, using chlorine gas ($Cl_2$). An insulating film 79 with a striped aperture is formed on the surface of the ridge structure. The insulating film 79 used is, for example, $SiO_2$ formed by vacuum evaporation. After the formation of the insulating film 79, a p-side electrode 80a and an n-side electrode 80b are made to obtain a substrate product. The p-side electrode 80a is produced by vacuum evaporation. The p-side electrode 80a is, for example, Ni/Au. A backside of this epitaxial substrate is polished down to 100 μm. The polishing of the backside is carried out using diamond slurry. The n-side electrode 80b is formed on the polished surface by evaporation. The n-side electrode 80b is constituted of Ti/Al/Ti/Au.

A laser bar is produced by scribing along the surface of this substrate product, using a laser scriber capable of applying a YAG laser beam at the wavelength of 355 nm. The conditions for formation of scribed grooves were as follows:
Laser beam output 100 mW;
Scanning speed 5 mm/sec.

The scribed grooves formed have, for example, the length of 30 μm, the width of 10 μm, and the depth of 40 μm. The scribed grooves are arranged at the pitch of 800 μm by applying the laser beam directly onto the epitaxial surface through apertures of insulating film on the substrate. The optical cavity length is 600 μm. Optical cavity mirrors are made by fracture using a blade. A laser bar is produced by breaking the substrate product by press against the back surface thereof.

FIG. 6 is a drawing showing a {20-21} plane in a crystal lattice and showing a scanning electron microscopical image of an end face for an optical cavity. More specifically, parts (b) and (c) of FIG. 6 show relations between crystal orientations and fractured faces in a {20-21}-plane GaN substrate. Part (b) of FIG. 6 shows plane orientations of end faces of the device in which the laser stripe extends in the <11-20> direction, and shows cleaved facets indicated, as end face 81d or c-plane 81, by the m-plane or c-plane having been used as optical cavity end faces of the conventional nitride semiconductor lasers. Part (c) of FIG. 6 shows plane orientations of end faces of the device in which the laser stripe is provided in the direction of the projected c-axis onto the primary surface (which will be referred to hereinafter as M-direction), and shows the end faces 81a and 81b for the optical cavity together with the semipolar plane 71a. The end faces 81a and 81b are approximately perpendicular to the semipolar plane 71a, but are different from the conventional cleaved facets such as c-plane, m-plane, or a-plane used heretofore.

In the laser diode on the {20-21}-plane GaN substrate according to the present example, since the end faces for the optical cavity are inclined with respect to the direction of polarity (e.g., the direction of the c+ axis vector), chemical properties of crystal planes of these end faces are not equivalent to each other. In the subsequent description, the end face 81b close to the +c plane will be referred to as {-1017} end face, and the end face 81a close to the −c plane as {10-1-7} end face. For descriptive purposes, the <−1014> and <10-1-4> directions, which are approximate normal vectors, are used as normal vectors to these end faces.

The end faces of the laser bar are coated with respective dielectric multilayer films 82a and 82b by vacuum evaporation. The dielectric multilayer films are made by alternately depositing two types of layers with mutually different refractive indices, e.g., $SiO_2$ and $TiO_2$. Each of the thicknesses of the films is adjusted in the range of 50 to 100 nm so that the center wavelength of reflectance is designed to fall within the range of 500 to 530 nm. The single wafer is divided into three in advance to produce three types of samples below.
Device A: A reflecting film (four cycles, reflectance 60%) is formed on the {10-1-7} end face. The {10-1-7} end face is defined as a light exit face (front).

A reflecting film (ten cycles, reflectance 95%) is formed on the {−1017} end face. The {−1017} end face is defined as a reflecting face (rear).
Device B: A reflecting film (ten cycles, reflectance 95%) is formed on the {10-1-7} end face. The {10-1-7} end face is defined as a reflecting face (rear).

A reflecting film (four cycles, reflectance 60%) is formed on the {−1017} end face. The {−1017} end face is defined as a light exit face (front).
Device C: The optical emitting face (front) and reflecting face (rear) are formed without consideration to crystal planes (in a mixed state among bars). The thicknesses of the reflecting films are the same as above.

These laser devices are mounted on a TO header and each mounted devices are energized to evaluate the device lifetime. A DC power supply is used as the power supply. Among the laser diodes thus produced, those with the lasing wavelength of 520 to 530 nm are evaluated as to the device lifetime. On the occasion of measurement of optical output, emission from the end face of each laser device is detected with a photodiode. During the measurement the ambient temperature is set at 27 degrees Celsius. The optical output is monitored under the condition of constant current to measure the lifetime of each laser diode. An electric current value is adjusted so that the initial value of optical output became 10 mW. Electric current values in the initial setting are different among the laser diodes, and distribute approximately in the electric current range of 80 to 150 mA. An elapsed time to half of the initial value of optical output is defined as a device lifetime. The measurement is continued for at most 500 hours.

The device lifetimes of the devices A to C are provided below (unit: hour).
Device type, Device A, Device B, Device C
SUB1: >500, 362, 346;
SUB2: >500, 366, 368;
SUB3: >500, 242, >500;
SUB4: >500, 340, >500;
SUB5: >500, 348, 346;
SUB6: >500, 312, 274;
SUB7: >500, 198, >500;
SUB8: >500, 326, >500;
SUB9: >500, 256, 172;
SUB10: >500, 242, 500.

An average of device lifetimes of each device type is calculated from the above results and the following results are obtained.
Device A: >500 h (over the lifetime of 500 hours).
Device B: 299 h (the average lifetime of 299 hours).
Device C: >400 h (over the lifetime of 400 hours).

The above results show that the excellent device lifetimes are achieved by taking account of the relation between the crystal planes and the total numbers of reflecting films in the laser diode chips fabricated from the same epitaxial substrate. Considering that since membrane stress increases with increase in the number of reflecting film layers, the device degradation tends to proceed with deterioration of crystal quality when the total number of films is large on the {10-1-7} plane side with weaker chemical properties like Device B. The degree of degradation is greater with increase in operating current and with increase in operating voltage. From the above tendency, the more heat is generated in the device and the less heat is dissipated from the device, the greater the degree of degradation is.

The polarity (plane orientation indicating the direction of the c-axis) in the end faces of the laser bar can be determined, for example, as follows: the laser bar is processed by the focused ion beam (FIB) method to form a plane parallel to the waveguide, and this plane is observed by the transmission electron microscopic (TEM) method through the estimation using convergent beam electron diffraction (CBED) method. The total number of films can be checked by observing the portions of the dielectric multilayer films using a transmission electron microscope. It is presumed that the cause of the device degradation is deterioration of crystal quality of the well layers, having a high In composition, in contact with the reflecting film. In order to suppress this deterioration to obtain a long-lifetime device, it is preferable to decrease the thickness of the reflecting film on the end face close to the -c plane and to increase the thickness of the reflecting film on the end face close to the +c plane.

For evaluating the fundamental characteristics of the fabricated lasers, evaluation by energization is carried out at room temperature. A pulsed power supply is used as the power supply to generate the pulse width of 500 ns and the duty ratio of 0.1%. In measurement of optical output, emission from the laser end face is detected with a photodiode, and the current-optical output characteristic (I-L characteristic) is measured. In measurement of emission wavelength, the emission from the laser end face is made to pass through an optical fiber and a spectrum thereof is measured using a spectrum analyzer as a detector. In estimating the polarization, the emission from the laser is observed through a polarizer, and the polarizer is rotated to estimate the polarization state of the laser beam. In observing LED-mode light, an optical fiber is provided to receive light emitted from the top surface of the laser to measure light emitted from the top surface of the laser device.

The polarization state in the lasing state is estimated for all the lasers, which shows that the emission is polarized in the a-axis direction. The lasing wavelength is in the range of 500 to 530 nm.

Figure 9:
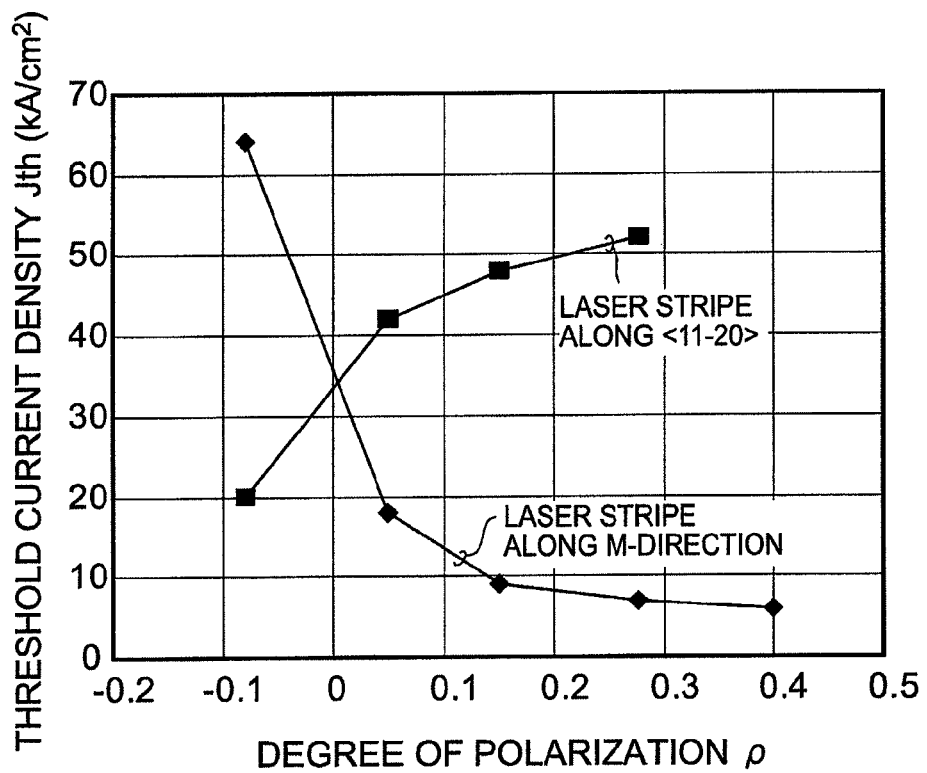
FIG. 9 is a drawing showing a relationship of determined polarization degree ρ versus threshold current density.

The polarization state of the LED-mode light (spontaneous emission) is measured with all the lasers. The degree of polarization ρ is defined as (I1−I2)/(I1+I2), where I1 indicates a polarization component in the direction of the a-axis, and I2 indicates a polarization component in the direction of the projected m-axis onto the primary surface. A relationship of determined polarization degree ρ versus minimum threshold current density is estimated in this way, and the result obtained is shown in FIG. 9. It is seen from FIG. 9 that when the polarization degree is positive, the threshold current density significantly decreases in the lasers with the laser stripe along the M-direction. Namely, it is seen that the threshold current density is largely decreased, when the polarization degree is positive (I1>I2) and when the waveguide is provided in the off direction. The data shown in FIG. 9 is as follows.

| Degree of polarization, | Threshold current, (M-direction stripe), | Threshold current. (<11-20> stripe) |
|---|---|---|
| 0.08, | 64, | 20. |
| 0.05, | 18, | 42. |
| 0.15, | 9, | 48. |
| 0.276, | 7, | 52. |
| 0.4 | 6. | |

Figure 10:
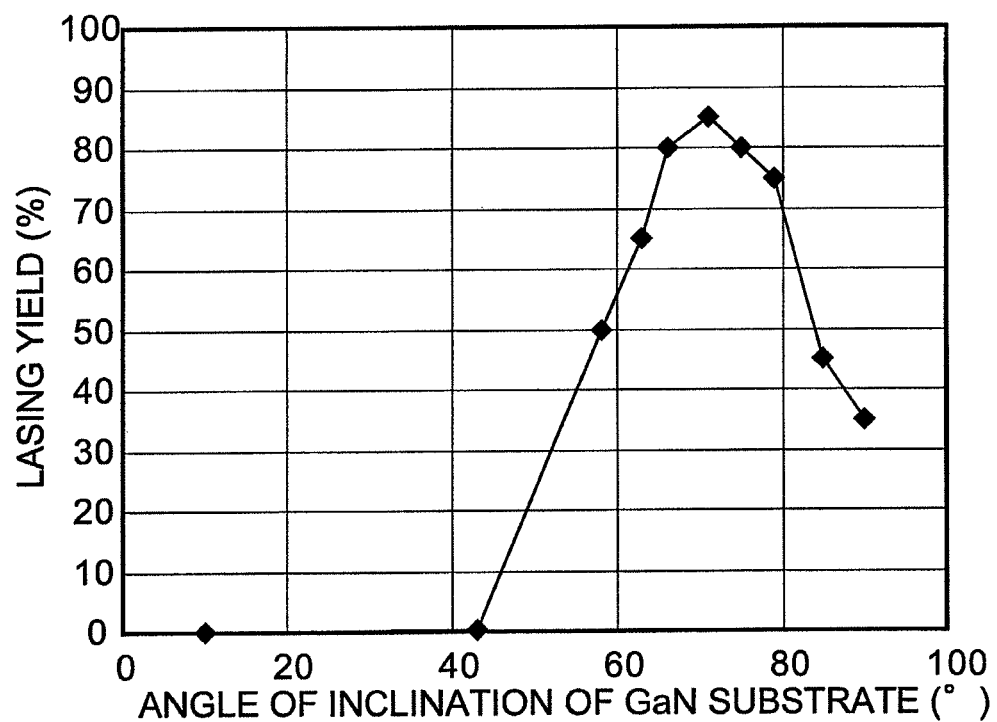
FIG. 10 is a drawing showing a relationship of inclination angle of the c-axis toward the m-axis direction of GaN substrate versus lasing yield.

A relationship of inclination angle of the c-axis toward the m-axis direction of the GaN substrate versus lasing yield is estimated, and the result obtained is shown in FIG. 10. In the present example, the lasing yield is defined as the following expression: (number of oscillating chips)/(number of measured chips). FIG. 10 is a plot of measured values in the lasers including the M-direction laser stripe and the substrate with the stacking fault density of not more than $1 \times 10^4$ (cm$^{-1}$). It is seen from FIG. 10 that the lasing yield is extremely low when the off angle is not more than 45 degrees. The end face state is observed with an optical microscope, and the observation shows that at angles smaller than 45 degrees, the m-plane appeared in almost all chips and the desired verticality is not achieved. It is also seen that in the range of the off angle of not less than 63 degrees and not more than 80 degrees, the verticality is improved and the lasing yield is also increased to 50% or more. From these results, the optimum range of the off angle of the GaN substrate is not less than 63 degrees and not more than 80 degrees. The same result is obtained in the range of not less than 100 degrees and not more than 117 degrees, which is the angular range where the end faces are crystallographically equivalent.

The data shown in FIG. 10 is as follows.

| Angle of inclination, | Yield. |
|---|---|
| 10, | 0.1. |
| 43, | 0.2. |
| 58, | 50. |
| 63, | 65. |
| 66, | 80. |
| 71, | 85. |
| 75, | 80. |
| 79, | 75. |
| 85, | 45. |
| 90, | 35. |

Example 2

Figure 16:
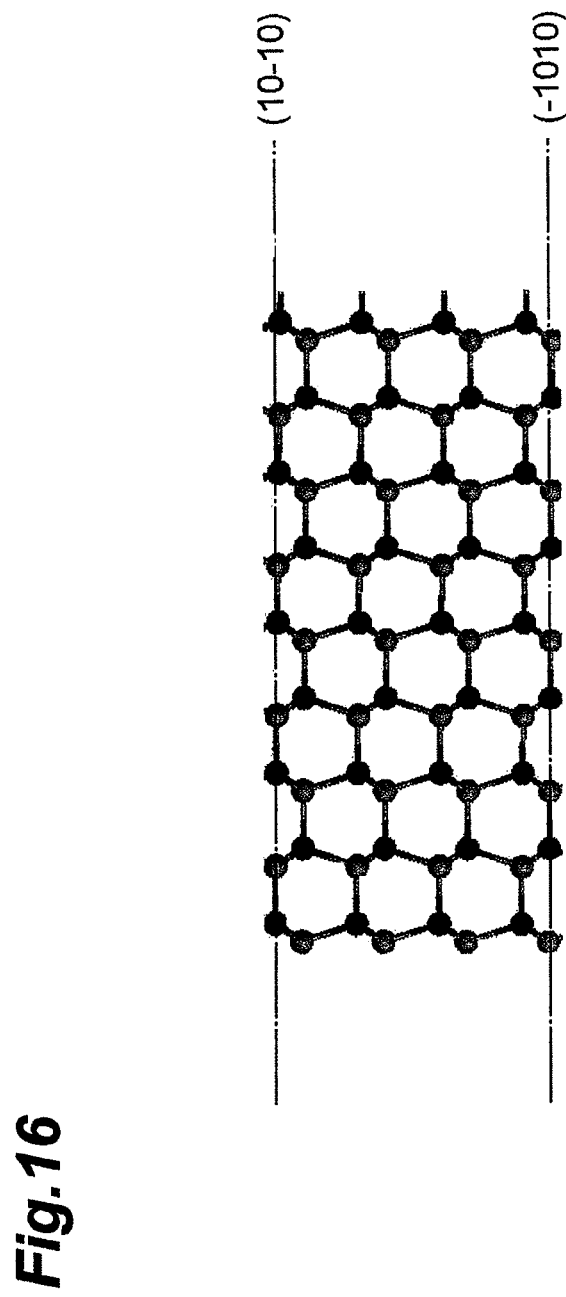
FIG. 16 is a drawing showing atomic arrangements in (10-10) and (−1010) planes perpendicular to the (000-1)-plane.

The below provides plane indices of primary surfaces of GaN substrates and plane indices perpendicular to the primary surfaces of substrates and nearly perpendicular to the direction of the projected c-axis onto the primary surface. The unit of angle is "degree."
Plane index of primary surface: Angle to (0001), Plane index of first end face perpendicular to primary surface, Angle to primary surface.
(0001): 0.00, (−1010), 90.00; part (a) of FIG. 11.
(10-17): 15.01, (−2021), 90.10; part (b) of FIG. 11.
(10-12): 43.19, (−4047), 90.20; part (a) of FIG. 12.
(10-11): 61.96, (−2027), 90.17; part (b) of FIG. 12.
(20-21): 75.09, (−1017), 90.10; part (a) of FIG. 13.
(10-10): 90.00, (0001), 90.00; part (b) of FIG. 13.
(20-2-1): 104.91, (10-17), 89.90; part (a) of FIG. 14.
(10-1-1): 118.04, (20-27), 89.83; part (b) of FIG. 14.
(10-1-2): 136.81, (40-47), 89.80; part (a) of FIG. 15.
(10-1-7): 164.99, (20-21), 89.90; part (b) of FIG. 15.
(000-1): 180.00, (10-10), 90.00; FIG. 16.
FIGS. 11 to 16 are drawings schematically showing atomic arrangements in crystal surfaces of plane indices available for the end faces for the optical cavity perpendicular to the primary surface. With reference to part (a) of FIG. 11, atomic arrangements in the (−1010) plane and (10-10) plane perpendicular to the (0001)-plane primary surface are schematically shown. With reference to part (b) of FIG. 11, atomic arrangements in the (−2021) plane and (20-2-1) plane perpendicular to the (10-17)-plane primary surface are schematically shown. With reference to part (a) of FIG. 12, atomic arrangements in the (−4047) plane and (40-4-7) plane perpendicular to the (10-12)-plane primary surface are schematically shown. With reference to part (b) of FIG. 12, atomic arrangements in the (−2027) plane and (20-2-7) plane perpendicular to the (10-11)-plane primary surface are shown. With reference to part (a) of FIG. 13, atomic arrangements in the (−1017) plane and (10-1-7) plane perpendicular to the (20-21)-plane primary surface are schematically shown. With reference to part (b) of FIG. 13, atomic arrangements in the (0001) plane and (000-1) plane perpendicular to the (10-10)-plane primary surface are schematically shown. With reference to part (a) of FIG. 14, atomic arrangements in the (10-17) plane and (−101-7) plane perpendicular to the (20-2-1)-plane primary surface are shown. With reference to part (b) of FIG. 14, atomic arrangements in the (20-27) plane and (−202-7) plane perpendicular to the (10-1-1)-plane primary surface are shown. With reference to part (a) of FIG. 15, atomic arrangements in the (40-47) plane and (−404-7) plane perpendicular to the (10-1-2)-plane primary surface are schematically shown. With reference to part (b) of FIG. 15, arrangements in the (20-21) plane and (−202-1) plane perpendicular to the (10-1-7)-plane primary surface are shown. With reference to FIG. 16, atomic arrangements in the (10-10) plane and (−1010) plane perpendicular to the (000-1)-plane primary surface are schematically shown. In these drawings, black dots indicate nitrogen atoms and white dots indicate Group III atoms.

Figure 11:
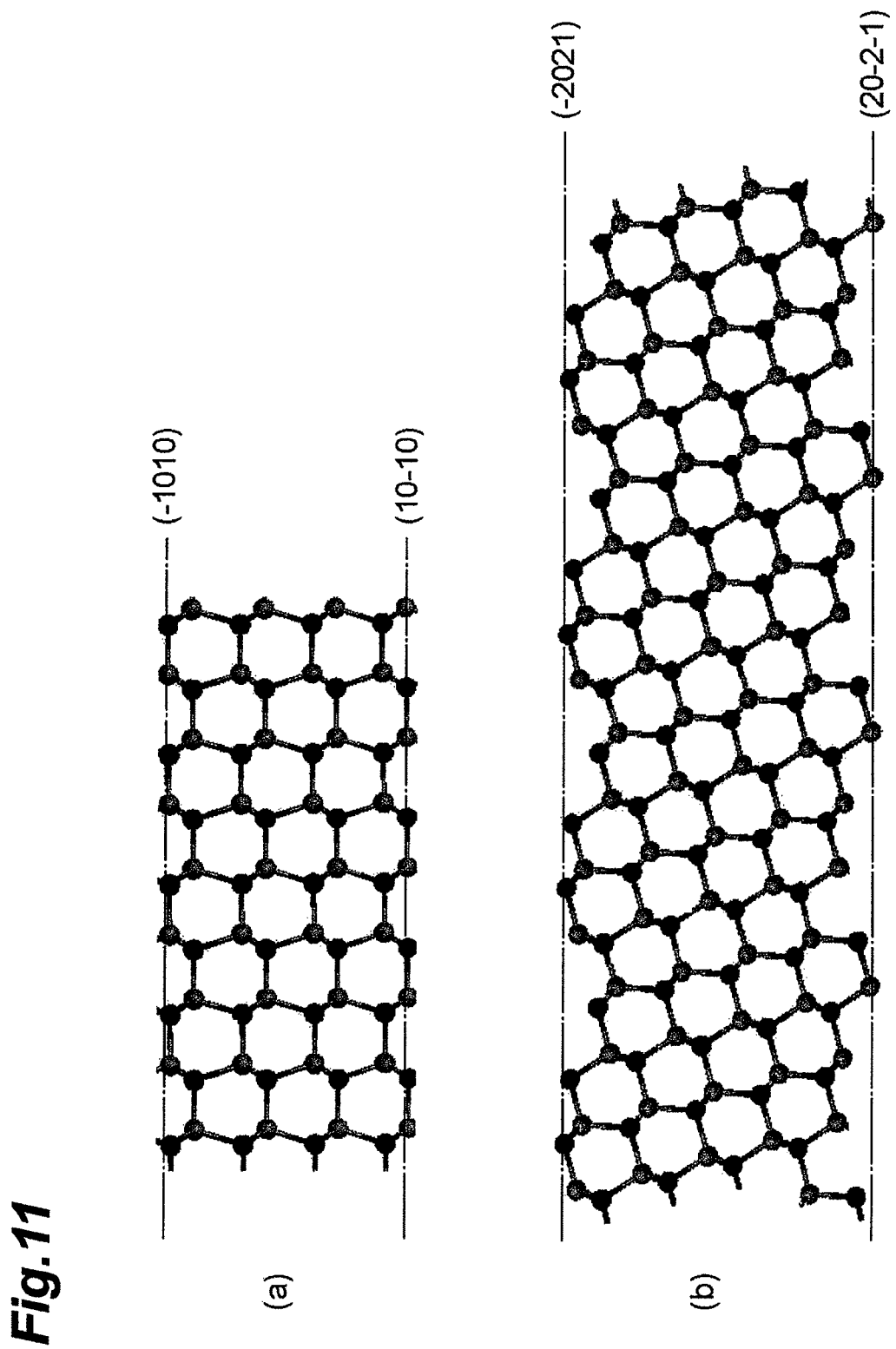
FIG. 11 is a drawing showing atomic arrangements in (−1010) and (10-10) planes perpendicular to a (0001)-plane primary surface, and atomic arrangements in (−2021) and (20-2-1) planes perpendicular to a (10-17)-plane of the primary surface.
Figure 12:
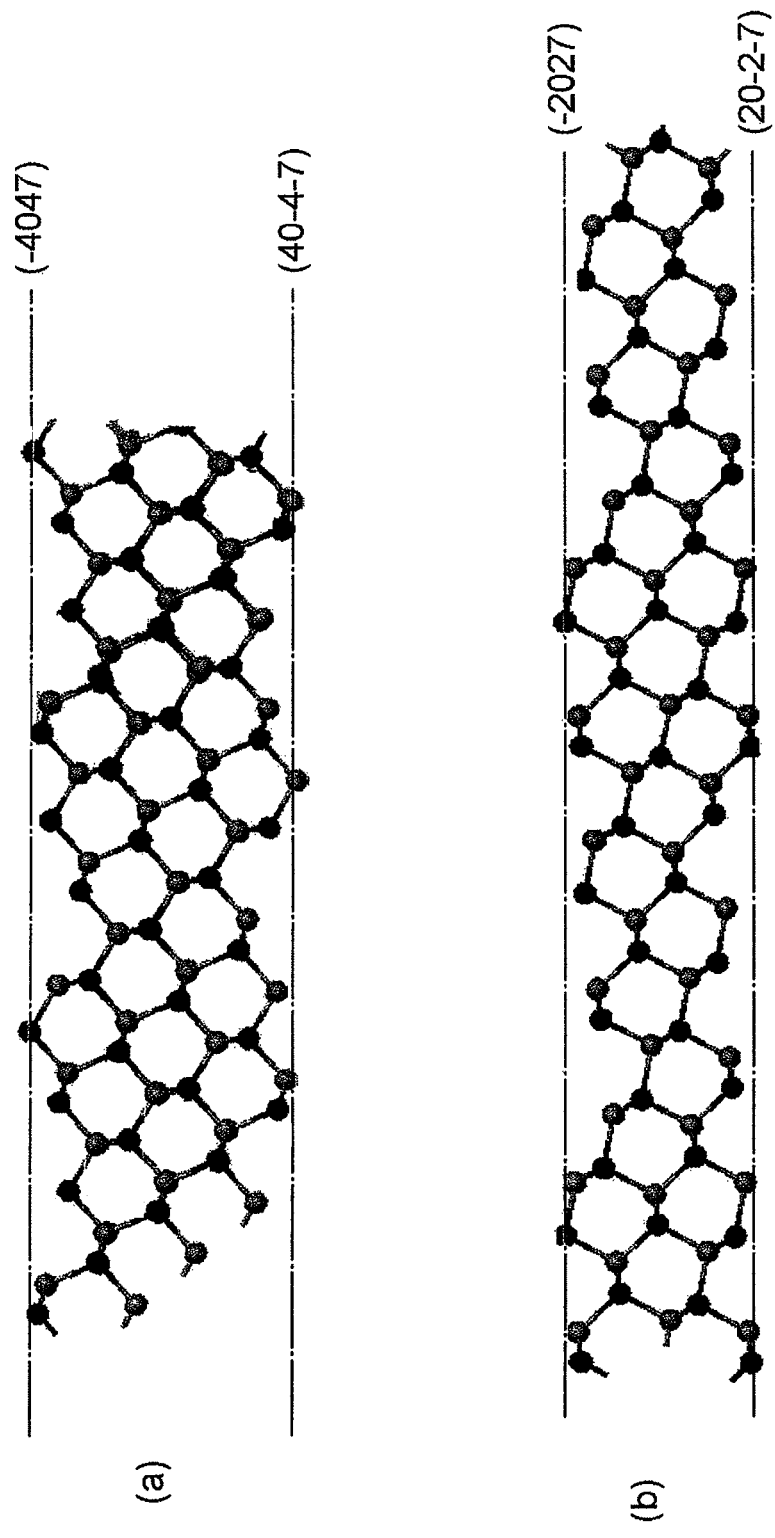
FIG. 12 is a drawing showing atomic arrangements in (−4047) and (40-4-7) planes perpendicular to a (10-12)-plane primary surface and atomic arrangements in (−2027) and (20-2-7) planes perpendicular to a (10-11)-plane primary surface.

It is understood with reference to FIGS. 11 to 16 that the surface arrangements of constituent atoms vary even in planes with a relatively small off angle from the c-plane, to significantly change the surface morphology. For example, part (b) of FIG. 11 shows the case where the primary surface of the substrate is (10-17) and the angle to the (0001) plane is about 15 degrees. In this case, the first end face is (−2021) and the second end face is (20-2-1); these two crystal planes are considerably different in kinds of constituent elements in the outermost surface and in the number and angles of bonds bound to the crystal, and thus have significantly different chemical properties. In the conventional case where the primary surface of the substrate is the (0001) plane commonly used for the nitride semiconductor lasers, as shown in part (a) of FIG. 11, the end faces for the optical cavity are the (10-10) plane and (−1010) plane; these two crystal planes have the same types of constituent elements in the outermost surface and the same number and angles of bonds bound to the crystal, and thus have the same chemical properties. It is shown that the types of constituent elements in the surfaces of the end faces and the number and angles of bonds bound to the crystal significantly vary with increase in the angle of inclination of the substrate primary surface from the (0001) plane. This reveals that if the laser diode has the substrate primary surface of the (0001) plane, the good laser device can be fabricated without special attention to characteristics of the end face coatings, whereas if the laser diode has a substrate with a primary surface of a semipolar plane, device characteristics can be improved by certainly unifying the plane orientations of the end faces in formation of the end face coats.

Figure 13:
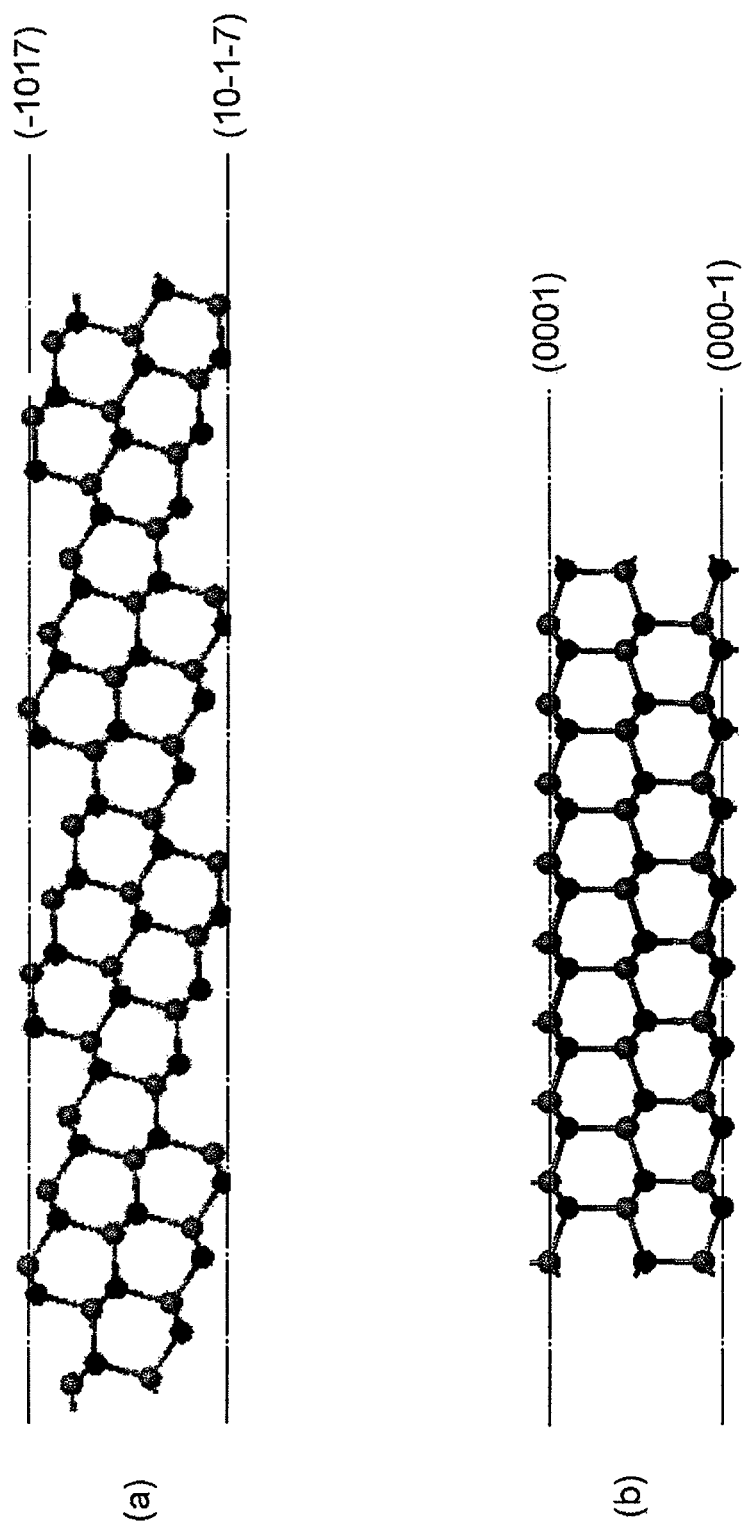
FIG. 13 is a drawing showing atomic arrangements in (−1017) and (10-1-7) planes perpendicular to a (20-21)-plane primary surface and atomic arrangements in (0001) and (000-1) planes perpendicular to a (10-10)-plane primary surface.
Figure 14:
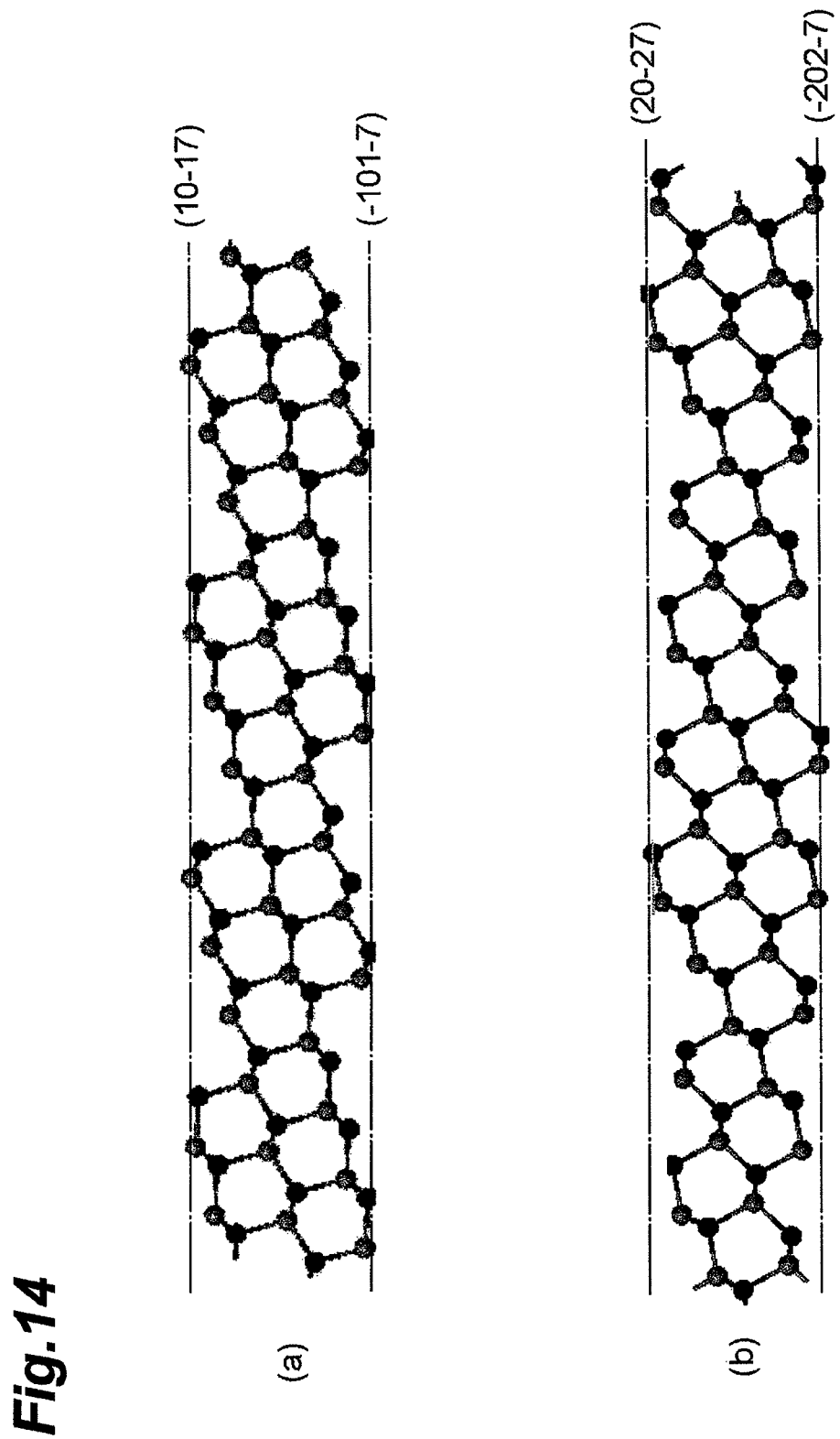
FIG. 14 is a drawing showing atomic arrangements in (10-17) and (−101-7) planes perpendicular to a (20-2-1)-plane primary surface and atomic arrangements in (20-27) and (−202-7) planes perpendicular to a (10-1-1)-plane primary surface.
Figure 15:
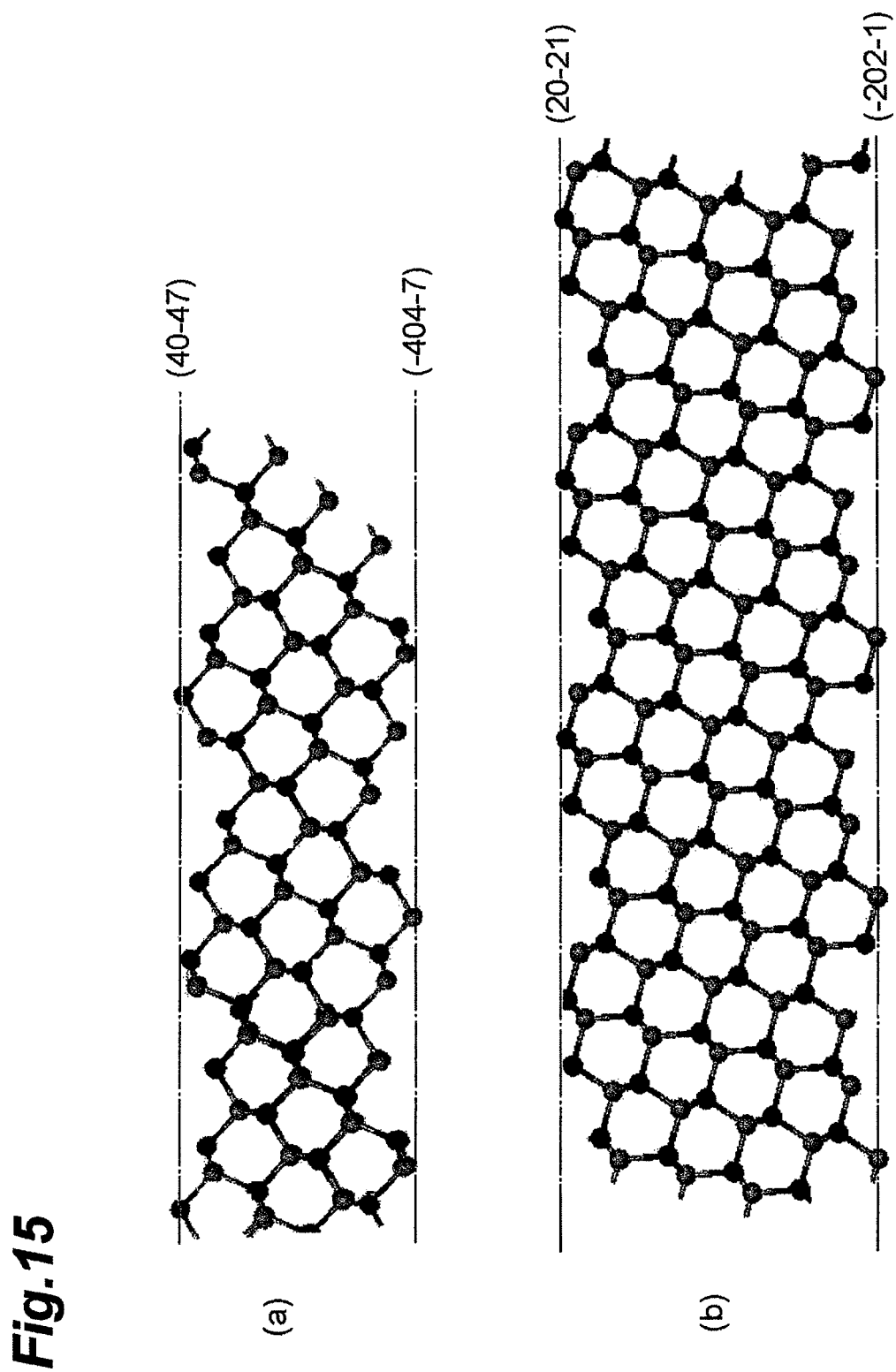
FIG. 15 is a drawing showing atomic arrangements in (40-47) and (−404-7) planes perpendicular to a (10-1-2)-plane primary surface and atomic arrangements in (20-21) and (−202-1) planes perpendicular to a (10-1-7)-plane primary surface.

According to Inventors' knowledge, it is presumed that reaction of nitrogen atoms at the surface with the end face coating films is promoted with increase in a rate of nitrogen atoms bound each through three bonds to the crystal and arranged at two or more continuous locations. For example, part (a) of FIG. 13 is the case where the substrate primary surface is the (20-21) plane and the angle to the (0001) plane is about 75 degrees. In this case, the first end face is the (−1017) plane, the second end face is the (10-1-7) plane, and in the (10-1-7) plane there are three continuous locations where each nitrogen atom is bound through three bonds to the crystal. Therefore, reaction with the end face coat film is likely to be promoted. At this time, the c+ axis vector indicating the direction of the <0001> axis of the GaN substrate is inclined at an angle in the range of approximately not less than 45 degrees and not more than 80 degrees or in the range of not less than 100 degrees and not more than 135 degrees toward the direction of any one crystal axis of the m-axis and the a-axis of the GaN substrate with respect to the normal vector indicating the direction of the normal axis to the primary surface of the GaN substrate.

In this laser diode, when the waveguide vector WV making the acute angle with the c+ axis vector is directed in the direction from the second end face (e.g., the end face 28 in FIG. 1) to the first end face (e.g., the end face 26 in FIG. 1), the thickness of the second dielectric multilayer film on the second end face (C− side) is smaller than the thickness of the first dielectric multilayer film on the first end face (C+ side); therefore, the second dielectric multilayer film is the front side and the laser beam is emitted from this front side. The first dielectric multilayer film is the rear side, and the laser beam is reflected by this rear side. When the thickness of the second dielectric multilayer film (C− film) on the front side is smaller than the thickness of the first dielectric multilayer film (C+ film) on the rear side, it is feasible to reduce the device degradation with deterioration of crystal quality proceeding from the second end face due to the dielectric multilayer film on the end face, and thereby avoiding the reduction in device lifetime.

According to various experiments including the above examples, the angle ALPHA can be in the range of not less than 45 degrees and not more than 80 degrees or in the range of not less than 100 degrees and not more than 135 degrees. In order to improve the lasing chip yield and device lifetime, the angle ALPHA can be in the range of not less than 63 degrees and not more than 80 degrees or in the range of not less than 100 degrees and not more than 117 degrees. In the case of the inclination of the <0001> axis toward the m-axis direction, the primary surface can be any one of typical semipolar planes, e.g., the {20-21} plane, {10-11} plane, {20-2-1} plane, and {10-1-1} plane. Furthermore, the primary surface can be a slightly inclined plane from these semipolar planes. The semipolar principal plane can be a slightly inclined plane off in the range of not less than −4 degrees and not more than +4 degrees toward the m-plane direction, for example, from any one of the {20-21} plane, {10-11} plane, {20-2-1} plane, and {10-1-1} plane. In the case of the inclination of the <0001> axis toward the a-axis direction, the primary surface can be any one of typical semipolar planes, e.g., the {11-22} plane, {11-21} plane, {11-2-1} plane, and {11-2-2} plane. Furthermore, the primary surface can be a slightly inclined surface from these semipolar planes. The semipolar principal plane can be a slightly inclined plane in the range of not less than −4 degrees and not more than +4 degrees toward the a-plane direction, for example, from any one of the {11-22} plane, {11-21} plane, {11-2-1} plane, and {11-2-2} plane.

As described above, the above embodiments provide the III-nitride semiconductor laser device with the long device lifetime. Furthermore, the above embodiment provides the method for fabricating the III-nitride semiconductor laser device with the long device lifetime.

Having been described and illustrated the principle of the present invention in the preferred embodiments, but it is recognized by those skilled in the art that the present invention can be modified in arrangement and in detail without departing from the principle. The present invention is by no means intended to be limited to the specific configurations disclosed in the embodiments. Therefore, the applicant claims all modifications and changes falling within the scope of claims and resulting from the scope of spirit thereof.

What is claimed is:

1. A method of fabricating a III-nitride semiconductor laser device, comprising the steps of:
   preparing a substrate with a semipolar primary surface, the semipolar primary surface comprising a hexagonal III-nitride semiconductor;
   forming a substrate product having a laser structure, an anode electrode, and a cathode electrode, the laser structure comprising a substrate and a semiconductor region, and the semiconductor region being formed on the semipolar primary surface;
   after forming the substrate product, forming first and second end faces; and
   forming first and second dielectric multilayer films for an optical cavity of the nitride semiconductor laser device on the first and second end faces, respectively,
   the first and second end faces intersecting with a reference plane, the reference plane being defined by a normal axis to the semipolar primary surface and any one crystal axis of a- and m-axes of the hexagonal III-nitride semiconductor,
   the semiconductor region comprising a first cladding layer of a first conductivity type gallium nitride-based semiconductor, a second cladding layer of a second conductivity type gallium nitride-based semiconductor, and an active layer, and the active layer being provided between the first cladding layer and the second cladding layer,
   the first cladding layer, the second cladding layer, and the active layer being arranged in a direction of the normal axis,
   the active layer comprising a gallium nitride-based semiconductor layer,
   the semipolar primary surface of the substrate being inclined at an angle in a range of not less than 45 degrees and not more than 80 degrees and of not less than 100 degrees and not more than 135 degrees with respect to a plane perpendicular to a c+ axis vector, and the c+ axis vector indicating a direction of the <0001> axis of the nitride semiconductor,
   the c+ axis vector making an acute angle with a waveguide vector, and the waveguide vector indicating a direction from the second end face to the first end face, and
   a thickness of the second dielectric multilayer film being smaller than a thickness of the first dielectric multilayer film.

2. The method according to claim 1, further comprising a step of, prior to forming the first and second dielectric multilayer films, determining plane orientations of the first and second end faces.

3. The method according to claim 1, wherein the step of forming the first and second end faces comprises the steps of:
   scribing a first surface of the substrate product; and
   breaking the substrate product by press against a second surface of the substrate product to form a laser bar having the first and second end faces,
   the first and second end faces of the laser bar being formed by the breaking,
   the first surface being opposite to the second surface,
   the semiconductor region being provided between the first surface and the substrate, and
   each of the first and second end faces of the laser bar being included in a fractured face, and the fractured face extending from the first surface to the second surface and being formed by the breaking.

4. The method according to claim 1, wherein a c-axis of the III-nitride semiconductor is inclined toward a direction of the m-axis of the nitride semiconductor.

5. The method according to claim 1, wherein the primary surface of the substrate is inclined in a range of not less than −4 degrees and not more than +4 degrees with respect to any one of {10-11}, {20-21}, {20-2-1}, and {10-1-1} planes.

6. The method according to claim 1, wherein a c-axis of the III-nitride semiconductor is inclined toward a direction of an a-axis of the nitride semiconductor.

7. The method according to claim 1, wherein the primary surface of the substrate is inclined in the range of not less than −4 degrees and not more than +4 degrees from any one of {11-22}, {11-21}, {11-2-1}, and {11-2-2} planes.

8. The method according to claim 1, wherein formation of the active layer comprises a step of growing a well layer of a strained gallium nitride-based semiconductor, and the strained gallium nitride-based semiconductor contains indium as a constituent element.

9. The method according to claim 1, wherein the active layer is provided to generate light at a wavelength of 430-550 nm.

10. The method according to claim 1, wherein the III-nitride semiconductor comprises GaN.

11. The method according to claim 1, wherein the first dielectric multilayer film has a dielectric layer, and the a dielectric layer in the first dielectric multilayer film is formed using at least one of silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide, and wherein the second dielectric multilayer film has a dielectric layer, and the dielectric layer in the second dielectric multilayer film is formed using at least one selected from silicon oxide, silicon nitride, silicon oxynitride, titanium oxide, titanium nitride, titanium oxynitride, zirconium oxide, zirconium nitride, zirconium oxynitride, zirconium fluoride, tantalum oxide, tantalum nitride, tantalum oxynitride, hafnium oxide, hafnium nitride, hafnium oxynitride, hafnium fluoride, aluminum oxide, aluminum nitride, aluminum oxynitride, magnesium fluoride, magnesium oxide, magnesium nitride, magnesium oxynitride, calcium fluoride, barium fluoride, cerium fluoride, antimony oxide, bismuth oxide, and gadolinium oxide.

\* \* \* \* \*